United States Patent
Kondo et al.

(10) Patent No.: US 6,717,187 B2
(45) Date of Patent: Apr. 6, 2004

(54) SEMICONDUCTOR OPTICAL DEVICE AND THE FABRICATION METHOD

(75) Inventors: Susumu Kondo, Tama (JP); Matsuyuki Ogasawara, Isehara (JP); Ryuzo Iga, Atsugi (JP); Yasuhiro Kondo, Atsugi (JP); Yoshio Noguchi, Isehara (JP); Masahiro Yuda, Ebina (JP); Ken Tsuzuki, Zama (JP); Satoshi Oku, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/124,835

(22) Filed: Apr. 18, 2002

(65) Prior Publication Data

US 2002/0187580 A1 Dec. 12, 2002

(30) Foreign Application Priority Data

Apr. 18, 2001 (JP) ........................ 2001-119443
May 11, 2001 (JP) ........................ 2001-141184
Sep. 6, 2001 (JP) ........................ 2001-269934

(51) Int. Cl.[7] ........................ H01L 31/72; H01L 31/109; H01L 31/0328; H01L 31/0336
(52) U.S. Cl. ........................ 257/183; 257/189; 257/200; 257/615; 372/46; 438/47
(58) Field of Search ........................ 257/183, 189, 257/141, 200, 615; 372/43, 46, 48, 74; 438/23, 29, 34, 35, 46, 47, 95 G

(56) References Cited

U.S. PATENT DOCUMENTS

| | | | | |
|---|---|---|---|---|
| 6,539,039 | B2 | * | 3/2003 | Furushima ................ 372/46 |
| 2003/0042495 | A1 | * | 3/2003 | Ogasawara et al. ........ 257/102 |
| 2003/0067010 | A1 | * | 4/2003 | Iga et al. ................... 257/103 |

FOREIGN PATENT DOCUMENTS

| | | |
|---|---|---|
| DE | 197 47 996 C1 | 10/1997 |
| JP | 61-290790 | 12/1986 |
| JP | 8-250806 | 9/1996 |
| JP | 9-214045 | 8/1997 |
| JP | 10-22579 | 1/1998 |

OTHER PUBLICATIONS

Y. Toyoda, K. Wakita, "Phase Evaluation of Tensile Strained Quantum Well Modulators", Extended Abstracts (The 62$^{nd}$ Autumn Meeting, 2001): The Japan Society of Applied Physics,Sep. 2001, 1 page and English translation.
S. Kondo, Y. Noguchi, K. Tsuzuki, M. Yuda, S. Oku, Y. Kondo, "Ru–doped Semi–Insulating InP buried InGaAlAs/InAlAs MQWs modulators", Extended Abstracts (The 62$^{nd}$ Autumn Meeting, 2001), The Japan Society of Applied Physics. Sep. 2001. 1 page and English translation.

(List continued on next page.)

*Primary Examiner*—Kamand Cuneo
*Assistant Examiner*—Asok Kumar Sarkar
(74) *Attorney, Agent, or Firm*—Kenyon & Kenyon

(57) ABSTRACT

A semiconductor optical device includes a semiconductor substrate and a stacked body formed by at least a first cladding layer, an active region and a second cladding layer; wherein both sides of the stacked body are buried by a burying layer formed by a semi-insulating semiconductor crystal; the burying layer includes a first layer that is placed adjacent to both sides of the stacked body and a second layer that is placed adjacent to the first layer; the first layer includes Ru as a dopant; composition of the second layer is different from the composition of the first layer, or a dopant of the second layer is different from the dopant of the first layer. The device can also be configured such that the width of the active region is smaller than the width of the cladding layers of the stacked body; and a Ru-doped semi-insulating layer is provided in a space between the burying layer and the active region in both sides of the active region.

6 Claims, 21 Drawing Sheets

31: n-InP substrate
32: Se-doped n-InP cladding layer
33: Nondoped InGaAsP guide layer
34: Nondoped InGaAlAs/InAlAs strained MQW (multiple quantum well) photoabsorption layer
35: Nondoped InGaAsP guide layer
36: Zn-doped p-InP cladding layer
37: Zn-doped InGaAs contact layer
38: SiO2 mask
39: Ru-doped InP layer
40: Fe-doped InP layer
41: SiO2 passivation film
42: p-electrode
43: n-electrode

OTHER PUBLICATIONS

T. Suzuki, J.H. Noh, T. Arakawa. Y. Miyagi, K. Tada, "Electroabsortive characterization of five layer asymmetric coupled quantum well", Extended Abstracts (The $62^{nd}$ Autumn Meeting. 2001): The Japan Society of Applied Physics. Sep. 2001, 1 page and English translation.

S. Kondo, Y. Noguchi, K. Tsuzuki, M. Yuda. S. Oku Y. Kondo. H. Takeuchi, Ruthenium–doped semi–insulating InP Buried In(iaA1As InA1As MQWs modulators. $13^{th}$ IPREM May 2001, pp. 19–20.

D. Soderstrom et al., "Electrical Characterization of Ruthenium–Doped InP Grown by Low Pressure Hydride Vapor Phase Epitaxy", Electrochemical and Solid–state Letters, 4(6) G53–G55 (2001).

D. Soderstrom et al., "Dopant Diffusion and Current–Voltage Studies on Epitaxial InP Codoped with Ru and Fe", Journal of Electronic Materials, vol. 30, No. 8, pp. 972–976 (2001).

D. Soderstrom et al., Studies on Ruthenium–Doped InP Growth by Low–Pressure Hydride Vapor–Phase Epitaxy, Journal of Electrochemical Society, 148 (7) G375–G378 (2001).

A. Dadgar et al., "Ruthenium: A superior compensator of InP", Applied Physics Letters, vol. 73, No. 26, Dec. 1998, pp. 3878–3880.

A. Dadgar et al., "Growth of Ru doped semi–insulating InP by low pressure metalorganic chemical vapor deposition", Journal of Crystal Growth 195 (1998), pp. 69–73.

A. van Geelen et al. "Ruthenium Doped High Power 1.48 $\mu$m Sipbh Laser", $11^{th}$ International Conference on Indium Phosphide and Related Materials, May 1999, pp. 203–206.

* cited by examiner

11: Semiconductor substrate
12: Buffer layer
13: Active layer
14: Cladding layer
15: Contact layer
16: Fe diffusion preventing layer
17: Fe-doped InP burying layer 10: n-InP substrate
20: Semiconductor stacked body
21a: n-InP cladding layer
22a: Active region formed by MQW active layer or MQW photoabsorption layer
23a: p-InP cladding layer
24a: p-InGaAsP contact layer
25a: p-InGaAs contact layer
31a: Void
31b: Void
50: SiO2 mask 1: Semiconductor substrate
2: Semiconductor stacked body
21: n-InP cladding layer
22: Photoabsorption layer
23: p-InP layer
24: p-InGaAsP layer
25: p-InGaAs contact layer
3a: Compound semiconductor
4a: p-electrode
4b: n-electrode 3: Burying layer
3a: Ru-doped InAlAs layer
3b: Ru-doped InP layer 3: Burying layer
3A: Ru-doped InAlAs layer
3B: Fe-doped InP layer 31: n-InP substrate
32: Se-doped n-InP cladding layer
33: Nondoped InGaAsP guide layer
34: Nondoped InGaAlAs/InAlAs strained MQW (multiple quantum well) photoabsorption layer
35: Nondoped InGaAsP guide layer
36: Zn-doped p-InP cladding layer
37: Zn-doped InGaAs contact layer
38: SiO2 mask
39: Ru-doped InP layer
40: Fe-doped InP layer
41: SiO2 passivation film
42: p-electrode
43: n-electrode 50: n-InP substrate
52: n-InP cladding layer
54: Photoabsorption layer
56: P-InP cladding layer
58: p-InGaAsP contact layer
60: p-InGaAs contact layer
62: Dielectric mask
64: Ru-doped layer
66: Semi-insulating InP burying layer
68: p-electrode
70: n-electrode 50: n-InP substrate
52: n-InP cladding layer
54: Photoabsorption layer
56: p-InP cladding layer
58: p-InGaAsP contact layer
60: p-InGaAs contact layer
62: Dielectric mask 64: Region formed by mass transport
66: Semi-insulating burying layer 50: n-InP substrate
52: n-InP cladding layer
54: Photoabsorption layer
56: P-InP cladding layer
58: p-InGaAsP contact layer
60: p-InGaAs contact layer
62: Dielectric mask
64: Region formed by mass transport
68: p-electrode
70: n-electrode
80: p-InP burying layer
82: n-InP burying layer

SEMICONDUCTOR OPTICAL DEVICE AND THE FABRICATION METHOD

BACKGROUND OF THE INVENTION

1. Field of the Invention

The present invention relates to a semiconductor optical device with a buried heterostructure (BH) useful for optical communication and to the fabrication method of the same. More particularly, the present invention relates to a buried structure semiconductor optical device structured such that a Ru-doped semi-insulating layer is inserted between a mesa stripe and a burying layer.

2. Description of the Related Art

As the burying layer of a semiconductor optical device such as a semiconductor laser diode or an optical modulator and the like, a current blocking layer formed by a pn buried structure and a current blocking layer formed by a semi-insulating layer are known. According to these current blocking layers, for example, currents can be concentrated on a light-emitting region in a semiconductor laser diode.

Since parasitic capacitance of the current blocking layer formed by the pn buried structure is larger than that of the current blocking layer formed by the semi-insulating layer, it is difficult to realize high-speed operation for the devices with the pn buried structure.

As for a current blocking layer using Fe-doped indium phosphide (InP) as a semi-insulating film, when a Zn-doped InP layer is used as a p type cladding layer, the conductivity of the current blocking layer near the mesa stripe is changed to p type due to inter-diffusion between Fe in the current blocking layer and Zn in the p type cladding layer, so that there occurs a problem in that resistivity of the current blocking layer becomes low. As a result, leakage current and junction capacitance increase. These problems also cause degradation of device characteristics.

That is, inter-diffusion between iron (Fe) and zinc (Zn) occurs when a Fe doped burying layer is placed adjacent to a Zn-doped cladding layer and/or a Zn-doped contact layer. The inter-diffusion causes degradation of device characteristics, especially, modulation characteristics. In addition, Zn atoms moved in an interstitial site due to inter-diffusion diffuse not only to the burying layer but also to an active layer adjacent to the Zn-doped cladding layer (in the case of the semiconductor laser diode), or to a photo-absorption layer adjacent to the Zn-doped cladding layer (in the case of the optical modulator). Thus, there is also a problem in that light emitting efficiency of the active layer is lowered, or the extinction characteristic of the photoabsorption layer is degraded.

Conventionally, there are the following technologies to solve these problems. Japanese laid-open patent application No. 10-22579 discloses a semiconductor laser diode having nondoped InAlAs as the burying layer. That is, since Fe is not doped in the burying layer, inter-diffusion between Fe and the p type dopant does not occur, so that degradation of characteristics due to inter-diffusion does not occur. However, since InAlAs is nondoped, there is a problem in that resistivity of InAlAs is low.

In addition, Japanese laid-open patent application No. 9-214045 discloses that a Fe diffusion preventing layer is inserted between a Zn-doped cladding layer and a Fe-doped InP burying layer. That is, as shown in FIG. 1, the Fe diffusion preventing layer 16 is inserted between the Fe-doped InP burying layer 17 and the mesa stripe which is formed by a buffer layer 12, an active layer 13, a cladding layer 14 and a contact layer 15. In the Japanese laid-open patent application No. 9-214045, as a specific example of the Fe diffusion preventing layer 16, an n-InP layer and a Fe-doped InP layer are disclosed, in which vacancy concentration of the Fe-doped InP layer is equal to or more than $5.0 \times 10^{14}$ cm$^{-3}$.

However, in order to grow the Fe-doped InP layer of which vacancy concentration is equal to or more than $5.0 \times 10^{14}$ cm$^{-3}$ as the Fe diffusion preventing layer 16, it is necessary to use a higher growth temperature (660° C.) than that used for growing the usual Fe-doped InP layer. Thus, thermal degradation may occur on the sides of the mesa stripe during growth.

In addition, although diffusion of Fe can be prevented by inserting an n-InP layer as the Fe diffusion preventing layer 16, there is a problem in that leakage currents increase since resistivity of the n-type InP layer between the cladding layer and the burying layer is low.

In addition, Japanese laid-open patent application No. 61-290790 discloses that a burying layer of Fe-doped InAlAs is formed by liquid phase epitaxy. Also in this case, as mentioned above, there is a problem in that Zn—Fe inter-diffusion occurs between the Zn-doped cladding layer and the Fe-doped InAlAs burying layer.

Recently, it was found that Ru-doped semi-insulating layer rarely causes inter-diffusion between Ru and Zn. Thus, a buried structure laser diode using a Ru-doped InP layer which is a semi-insulating film as the current blocking layer is proposed in A. van Geelen et al., Appl. Physics Letters 73, No 26 pp 3878–3880 (1998), and A. van Geelen et al., 11th International Conference on Indium Phosphide and Related materials TuBl-2 (1999) for example. FIG. 2 shows the configuration.

However, as for the Ru-doped InP burying layer proposed in the above-mentioned documents, a precipitate of Ru—P is apt to occur. Thus, there is a problem in that it becomes difficult that Ru effectively acts as the semi-insulating dopant of InP.

Therefore, in order to suppress occurrence of the Ru—P precipitate, it is necessary to grow the semi-insulating layer under very restricted conditions such as under lowered growth pressure, or lowering the supplying amount of phosphine (PH$_3$), which is the source material for P, or under low growth temperature of about 580° C. or the like.

In patent DE19747996C1, when the number of hydrogen groups of the group V precursor is equal to or less than 2, the growth temperature of the Ru-doped compound semiconductor can be lower than that for PH$_3$ or AsH$_3$ with 3 hydrogen groups, which is mainly used. Since the decrease in the number of hydrogen groups reduces the decomposition temperature of the group V precursor, the growth temperature can be lowered, so that occurrence of the precipitate with Ru can be suppressed.

When growing the semi-insulating layer at the low growth temperature as mentioned above, there occurs a problem in that a defect such as hillock is apt to occur on the surface of the burying layer.

In addition, as for the Ru-doped InP, the surface of the crystal becomes very sensitive, and poor crystal habit easily occurs. Thus, depending on the condition of the surface layer after performing RIE (Reactive Ion Etching) or wet etching, a void may occur in the Ru-doped InP burying layer 30 as shown in FIG. 3. In FIG. 3, the reference numeral 10 indicates an n-InP substrate, 20 indicates the semiconductor stacked body, 21a indicates an n-InP cladding layer, 22a indicates an active region formed by a MQW active layer or MQW photoabsorption layer, 23a indicates a p-InP cladding layer, 24a indicates a p-InGaAsP contact layer, 25a indicates a p-InGaAs contact layer, 31a indicates a void in the side wall of the mesa stripe, and 31b indicates a void in the side wall including InAlAs.

In addition, when burying a device with the active region formed by an InAlAs—InGaAlAs multiple quantum well layer that acts as the active layer or the photoabsorption layer, a void easily occurs on the side wall of the active region. Thus, there is a problem of reliability, reproducibility and the like. In addition, it is difficult to change a physical constant such as the lattice constant and the index of refraction for the InP layer and the like.

There is a method of mass transport as a method for burying the side surface of the active region as disclosed in Japanese laid-open patent application No. 8-250806, for example.

Processing damage on the side surface of the active region due to formation of the mesa stripe is removed by using wet etching. After that, the device is loaded in a growth reactor. When the growth temperature rises, a part of the cladding layer is dissolved, is moved to the side surface of the active region and recrystallized. As a result, the side surface of the active region is buried by a material for the cladding region.

According to this method, surface damage of the processed layer due to dry etching can be removed, and thermal damage due to the rise in temperature can be prevented.

However, by this mass transport method, since the part of the material of the cladding region is dissolved, moved to the side surface of the active region and recrystallized for performing the burying process, impurity doped in the cladding layer is moved with the material and included in the burying layer that is recrystallized. Therefore, the area of junction region may increase and leakage currents may increase.

In addition, the impurity included in the material of the dissolved cladding layer diffuses to the active region adjacent to the burying layer, and the diffusion may cause deterioration of light emitting characteristics of the active layer or extinction characteristics of the photoabsorption layer. Especially, when Zn, which is a p-type impurity, is included in the region formed by the mass transport, the p-type burying layer and the region formed by mass transport are connected in the case of pn-junction buried structure, or, it causes inter-diffusion between Fe and Zn, and leakage currents and junction capacitance increase when using a Fe-doped semi-insulating layer as the burying layer.

As mentioned above, a Fe-doped semiconductor crystal is used for the semi-insulating buried heterostructure (SIBH). However, there is a problem in that inter-diffusion between Fe in the burying layer and Zn, which is a dopant of the p-cladding layer and p-contact layer, occurs at the interface of the burying layer and the Zn-doped layer. As a result, Zn atoms diffuse to the burying layer, which causes device characteristics degradation, especially, modulation characteristics degradation.

In addition, in a conventional technology using a Ru-doped InP burying layer such as A. van Geelen et al., Appl. Physics Letters 73, No 26 pp 3878–3880 (1998), bis ($\eta$5-2,4-dimethylpentadienyl ruthenium (II)) is used as a source material gas of Ru, and an InP crystal in which Ru is doped to $4 \times 10^{13}$ cm$^3$ is grown by using a metalorganic vapor phase epitaxy method. The mass transport is not used.

In a conventional technology disclosed in A. van Geelen et al., 11th International Conference on Indium Phosphide and Related materials TuBl-2 (1999), fabrication of a semiconductor laser diode is disclosed in which a Ru-doped semi-insulating InP layer and an n-InP hole blocking layer formed on the Ru-doped InP layer are used as the burying layer. Also in this example, growth of the burying layer is performed by an epitaxial growth method using the MOVPE method, and mass transport is not used.

That is, when using mass transport in the conventional technology, there are problems in that the region formed by mass transport becomes p type, junction capacitance increases, and leakage current paths occur. Therefore, performance of the device degrades, and there is a problem in that fabrication yield is low. In addition, Ru doping is performed by the epitaxial growth method and mass transport is not used.

SUMMARY OF THE INVENTION

An object of the present invention is to provide a semiconductor optical device having a structure in which Zn atoms do not diffuse to the burying layer and to the active region.

Especially, in a semiconductor optical device with a structure in which a diffusion preventing layer is inserted between the mesa stripe and the semi-insulating burying layer, the object of the present invention is to provide a semiconductor optical device with a structure in which the material of the diffusion preventing layer is improved, so that thermal degradation of the side walls of the mesa stripe is prevented during growth of the burying layer and leakage current paths of the side walls of the mesa stripe are eliminated.

Another object of the present invention is to solve drawbacks of the conventional fabrication method of a semiconductor optical device using mass transport. That is, the object is to provide a method for fabricating a high performance semiconductor optical device that prevents leakage current paths and inter-diffusion, and that has few leakage currents and small junction capacitance and provides improvement in yield.

The object can be achieved by a semiconductor optical device, comprising:

a semiconductor substrate;

a stacked body formed at least by a cladding layer having a first conductivity, an active region formed by an active layer or a photoabsorption layer and a cladding layer having a second conductivity, the stacked body being provided on the semiconductor substrate and formed like a mesa stripe;

wherein both sides of the stacked body are buried by a burying layer formed at least by a semi-insulating semiconductor crystal;

the burying layer includes a first layer that is placed adjacent to both sides of the stacked body and a second layer that is placed adjacent to the first layer;

the first layer includes Ru as a dopant;

composition of the second layer is different from the composition of the first layer, or, a dopant of the second layer is different from a dopant of the first layer.

In the present invention, the semiconductor optical device is formed such that the Ru-doped layer is provided in both sides of the stacked body, and at least a layer is provided in which the composition of the layer is different from the composition of the Ru-doped layer or a semi-insulating dopant of the layer is different from a semi-insulating dopant of the Ru-doped layer.

Conventionally, as disclosed in A. van Geelen et Al., 11th IPRM TuBl-2 (1999), a single burying layer is used. On the other hand, in the present invention, at least two different layers are used as the burying layer. A first layer in the two different layers is a relatively thin Ru-doped layer, and is placed adjacent to the mesa stripe. A second layer in the two different layers is a relatively thick layer provided such that it covers the first layer, in which the composition of the second layer is different from that of the first layer, or, the dopant in the second layer is different from that in the first layer.

In a fabrication process, the growth of the Ru-doped compound semiconductor layer is more difficult than that of the Fe-doped compound semiconductor layer. However, by adopting the buried structure of the present invention, the ratio of growth process of the Ru-doped layer to total burying layer growth process can be decreased. Since the Ru-doped layer is sensitive to surface condition of a processed substrate, it is difficult to grow the Ru-doped layer. However, by adopting the structure of the present invention, the difficulty for growth can be relieved since the thickness of the Ru-doped layer can be relatively thin. In addition, since the major part of the burying layers is formed by a stable burying layer, fabrication yield can be improved.

Therefore, a device structure can be provided in which defect due to difficulty of growth can be prevented, and fabrication yield can be improved. That is, Zn diffusion can be prevented by using the Ru-doped compound semiconductor layer, and in addition, defects occurring in the fabrication process can be prevented.

In the above structure, the composition of the first layer may be Ru-doped InGaAlAs or Ru-doped InAlAs.

By adopting such composition, since the dopant is Ru, inter-diffusion between Ru and Zn can be prevented. In addition, as for an alloy semiconductor crystal layer such as InAlAs and InGaAlAs, since the diffusion rate of a doped impurity is much smaller than that of a binary compound semiconductor such as InP, the inter-diffusion between Ru and Zn can be further suppressed compared with the case of InP. Therefore, resistivity is not lowered, and a highly resistive current blocking layer can be obtained. Thus, increases of capacitance and leakage currents can be suppressed.

In addition, the dependence of the quality of the Ru-doped InAlAs or Ru-doped InGaAlAs on surface condition is smaller than that of the Ru-doped InP, and the Ru-doped InAlAs or Ru-doped InGaAlAs is easier to grow than the Ru-doped InP. Thus, defects hardly occur.

In addition, the Ru-doped InAlAs or InGaAlAs is not susceptible to surface damage or an oxidized layer due to RIE or wet etching and the like. Thus, voids hardly occur in the Ru-doped InAlAs or InGaAlAs compared with Ru-doped InP.

In addition, since the binding strength between doped Ru and As forming InAlAs and InGaAlAs is much weaker than that between Ru and P forming InP, the possibility that a precipitate such as Ru—As occurs during the growth of crystals of InAlAs or InGaAlAs becomes small. Therefore, it becomes possible to easily grow a highly resistive semiconductor layer without adopting very narrow growth conditions as in the conventional Ru-doped InP.

In addition, since the InAlAs and the InGaAlAs are alloy semiconductor crystals, it becomes possible to easily change a physical constant such as refractive index and bandgap and the like while keeping the condition of lattice matching with the InP substrate by changing the composition of Ga and Al.

In addition, since the physical constants such as refractive index and bandgap can be changed by changing the composition, flexibility of device design increases.

That is, according to the present invention, since leakage currents can be suppressed and voids hardly occur, it becomes possible to provide a reliable semiconductor optical device with high performance.

In addition, since Al is not exposed on the surface of the semiconductor stacked layers due to burying another burying layer on the top surface of InAlAs or InGaAlAs, it becomes possible to easily form other devices on the surface of the semiconductor stacked layers.

Since the first layer of the present invention comprises the Ru-doped InAlAs or InGaAlAs, the first layer is different from nondoped InAlAs layer disclosed in Japanese laid-open patent application No. 10-22579, the Fe-doped InAlAs layer disclosed in Japanese laid-open patent application No. 61-290790 and the Ru-doped InP layer disclosed in A. van Geelen et al.

That is, the present invention is different from Japanese laid-open patent application No. 10-22579 in that Ru is doped so that resistivity is increased. In addition, this invention is different from Japanese laid-open patent application No. 61-290790 in that Ru is used as the semi-insulating impurity that is doped instead of Fe. Therefore, diffusion of Zn dopant in the cladding layer does not occur. In addition, the present invention is different from A. van Geelen et al. in that Ru is doped in InAlAs or InGaAlAs not in InP. Therefore, physical constants such as refractive index or bandgap and the like can be changed by changing the composition, so that flexibility in device design is increased.

In addition, the present invention is different from Japanese laid-open patent application No. 9-214045 because the present invention adopts a structure in which another burying layer is stacked on, for example, a top surface of the burying layer formed by the Ru-doped InAlAs or InGaAlAs.

That is, in the technology in Japanese laid-open patent application No. 9-214045, the Fe diffusion preventing layer formed by a low-resistive n-InP layer is inserted between the Zn-doped cladding layer and the Fe-doped InP burying layer. On the other hand, according to the present invention, a burying layer formed by highly resistive Ru-doped InAlAs or InGaAlAs is inserted between the cladding layer and other burying layer. Therefore, leakage currents do not increase. Ru-doped InP can be used as the second layer in the above structure.

In the above-mentioned structure, Ru-doped InP can be used instead of Ru-doped InAlAs or Ru-doped InGaAlAs as the material of the first layer. Accordingly, Zn diffusion can be prevented and the increase in leakage current which was the conventional problem can be prevented. In addition, Fe-doped InP can be used as the second layer. By adopting this structure, fabrication technology established by the conventional Fe-doped InP can be used for growth of the second layer, which occupies most of the burying process.

More concretely, in the semiconductor optical device, since the Ru-doped layer is inserted between the mesa stripe and the Fe-doped InP layer, a semi-insulating impurity does not diffuse from the Fe-doped InP layer to the mesa stripe.

Therefore, resistivity of the Fe-doped InP layer is not lowered, and an impurity such as Zn atoms doped in a layer forming mesa stripe does not diffuse to the Fe-doped InP layer or the active region. In addition, since Ru-doped InP is semi-insulating, leakage current paths do not occur between the mesa stripe and the Fe-doped InP burying layer. In addition, since the growth temperature of the Ru-doped compound semiconductor layer is the same or lower than that of Fe-doped InP, thermal degradation of side walls of the mesa stripe can be suppressed during growth.

In the semiconductor laser diode disclosed in Japanese laid-open patent application No. 9-214045, a Fe diffusion preventing layer formed by an n-InP or Fe-doped InP layer whose vacancy concentration is equal to or more than $5.0 \times 10^{14}$ cm$^{-3}$ is inserted between the mesa stripe and the Fe-doped InP burying layer. On the other hand, a different point is that, according to the semiconductor optical device of the present invention, a Ru-doped layer is inserted.

Therefore, the Ru-doped layer acts as a diffusion preventing layer and a current blocking layer. Thus, leakage current paths do not occur in the side walls of the mesa stripe. That is, as for effects, the present invention is different from the conventional technology in that the Ru-doped layer acts as the diffusion preventing layer, and in addition, acts as the current blocking layer.

In addition, Japanese laid-open patent application No. 9-214045 discloses only the effect of preventing diffusion. Although it discloses that a Fe-doped InP layer in which vacancy concentration is equal to or more than $5.0 \cdot 10^{14}$ cm$^{-3}$ is used as a Fe diffusion preventing layer, it does not disclose that the Fe-doped InP layer indicates high resistivity and becomes a current blocking layer. In addition, it is impossible to think that it indicates enough high resistivity because the defect density is too high since the vacancy concentration is equal to or more than $5.0 \times 10^{14}$ cm$^{-3}$.

In addition, the present invention provides a structure in which Ru-doped InP formed by mass transport is provided in the both sides of the active region for preventing Zn diffusion and increase of current leakage.

That is, the present invention is a semiconductor optical device comprising:

a semiconductor substrate;

a stacked body formed at least by a cladding layer having a first conductivity, an active region formed by an active layer or a photoabsorption layer and a cladding layer having a second conductivity, the stacked body being provided on the semiconductor substrate and formed like a mesa stripe;

wherein both sides of the stacked body are buried by a burying layer formed at least by a semi-insulating semiconductor crystal;

the width of the active region is smaller than the width of the cladding layers of the stacked body; and a Ru-doped semi-insulating layer is provided in a space between the burying layer and the active region in both sides of the active region. The Ru-doped semi-insulating layer can be Ru-doped InP formed by using mass transport. In addition, a Ru-doped semi-insulating layer can be provided as the burying layer by epitaxial growth method such that the Ru-doped semi-insulating layer covers the Ru-doped semi-insulating layer provided in the space. In addition, composition of the Ru-doped semi-insulating layer provided by the epitaxial growth method may be Ru-doped InP or Ru-doped InAlAs or Ru-doped InGaAlAs.

In addition, the object can also be achieved by a method used for fabricating a semiconductor optical device by using mass transport, the method comprising the steps of:

forming a stacked body by successively growing at least a cladding layer having a first conductivity, an active region formed by an photoabsorption layer or an active layer, and a cladding layer having a second conductivity;

forming a mask with a predetermined shape, and etching the stacked body by using the mask, so that a mesa stripe is formed;

etching both sides of the active region by performing selective etching such that the width of the active region becomes smaller than the width of the cladding layers in the stacked body;

burying both sides of the active region by mass transport while supplying a source material gas of Ru; and burying both sides of the stacked body with a Ru-doped semi-insulating semiconductor.

According to the present invention, the Ru-doped semiconductor layer is semi-insulating, and inter-diffusion between Ru and p-type impurity does not occur, so that stable highly resistive layer can be realized and a current blocking layer with good quality can be realized. Thus, by providing the Ru-doped layer in both sides of the active region, the pn junction area can be decreased and leakage currents in the side walls of the active region can be decreased, so that a high-performance modulator and light emitting device with good characteristics can be realized.

Ru can be easily doped in a region formed by mass transport by supplying a Ru precursor into the growth reactor during the mass transport process. Therefore, by burying the both sides of the active region by using mass transport, the buried region (region formed by mass transport) becomes semi-insulating. Thus, by compensation of holes by Ru, a semi-insulating layer can be formed even when a p-impurity (Zn) is included in the region formed by mass transport. The present invention is different from the conventional technology in that the metalorganic gas including Ru is supplied into the growth reactor during the mass transport process.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

In the following, embodiments of the present invention will be described with reference to figures.

First Embodiment

FIGS. 4–9 are section views for explaining an example of a fabrication process of an optical modulator using the compound semiconductor of the present invention as the burying layer. The optical modulator shown in each embodiment of the present invention is an electroabsorption modulator (EA modulator) using MQW as the photoabsorption layer.

Figure 9:
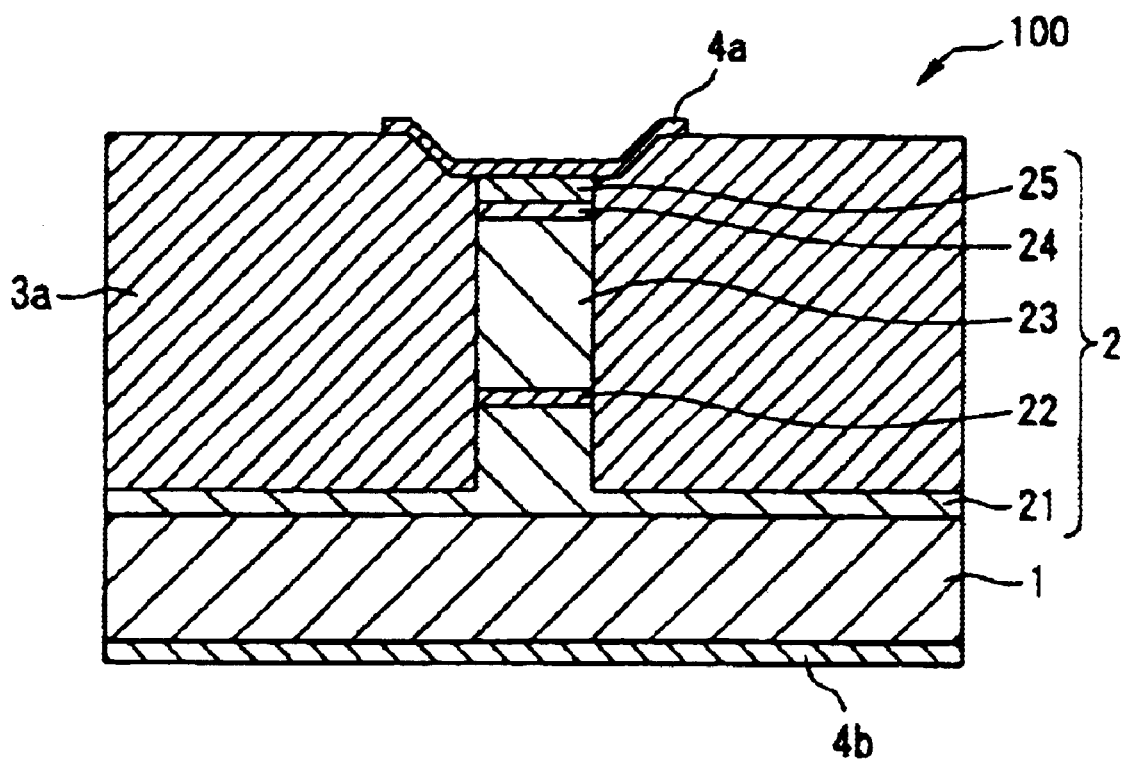

As shown in FIG. 9, the electroabsorption modulator of the first embodiment of the present invention includes a semiconductor substrate 1 formed by n-InP, a semiconductor stacked body 2 provided on top of the n-InP semiconductor substrate 1, a compound semiconductor 3a burying both sides of the semiconductor stacked body 2, a p-electrode 4a provided on the top and n-electrode 4b provided on the bottom of the semiconductor substrate 1.

The semiconductor stacked body 2 includes an 1 $\mu$m-thick n-InP layer 21, a 0.2 $\mu$m-thick photoabsorption layer 22, an 1.5 $\mu$m-thick p-InP layer 23, a 0.5 $\mu$m-thick p-InGaAsP layer 24 and a 0.3 $\mu$m-thick p-InGaAs contact layer 25 which were grown successively on the semiconductor substrate 1. The compound semiconductor that forms each semiconductor film has a composition that provides lattice matching with the InP substrate 1.

The photoabsorption layer 22 includes a 40 nm-thick nondoped InGaAsP layer, a MQW (multiple quantum well) layer in which 6 pairs of 5 nm-thick InGaAlAs well layer and 11 nm-thick InAlAs barrier layer are stacked alternately, and a 40 nm-thick nondoped InGaAsP layer. Source materials for the compound semiconductors are trimethylindium, triethylgallium, trimethylaluminum, diethylzinc, phosphine, arsine and silane.

The semiconductor stacked body 2 is processed into the mesa stripe, and the both sides of the mesa stripe are buried by the Ru-doped InAlAs layer 3a.

Source materials for the compound semiconductor forming the InAlAs layer 3a are trimethylindium, trimethylaluminum, and arsine. And, bis ($\eta^5$- 2-4-dimethylpentadienyl)ruthenium is used as the source material for Ru.

The p-electrode 4a is formed by AuZn/Au, and the n-electrode 4b is formed by AuGeNi.

Next, a fabrication method of the electroabsorption modulator 100 of the present invention will be described.

Figure 1:
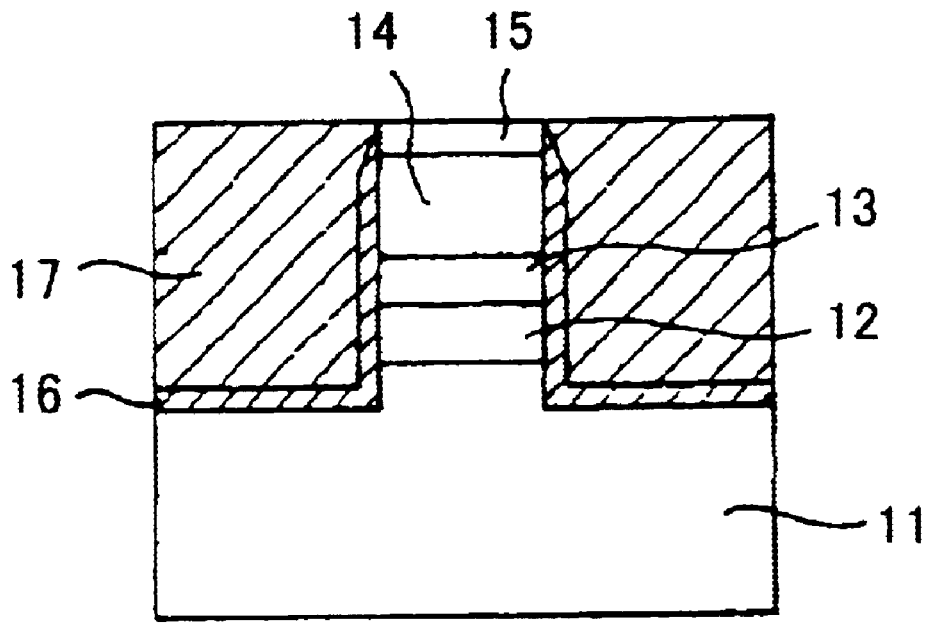
FIG. 1 is a figure for explaining a conventional example (Japanese laid-open patent application No. 9-214045)
Figure 2:
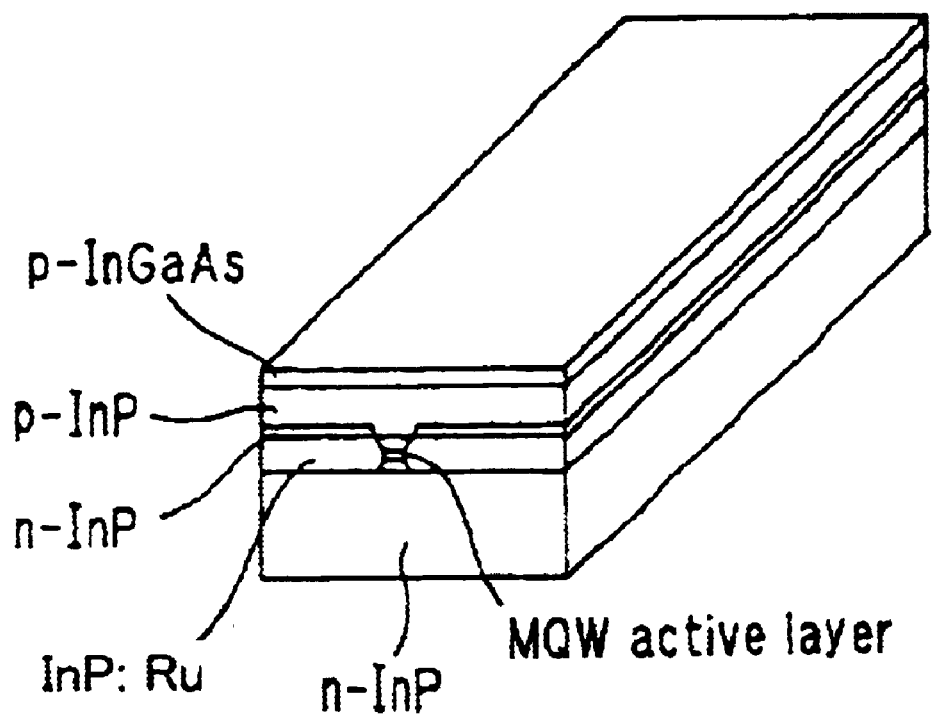
FIG. 2 is a figure for explaining a conventional example (van Geelen et al., (1999))
Figure 3:
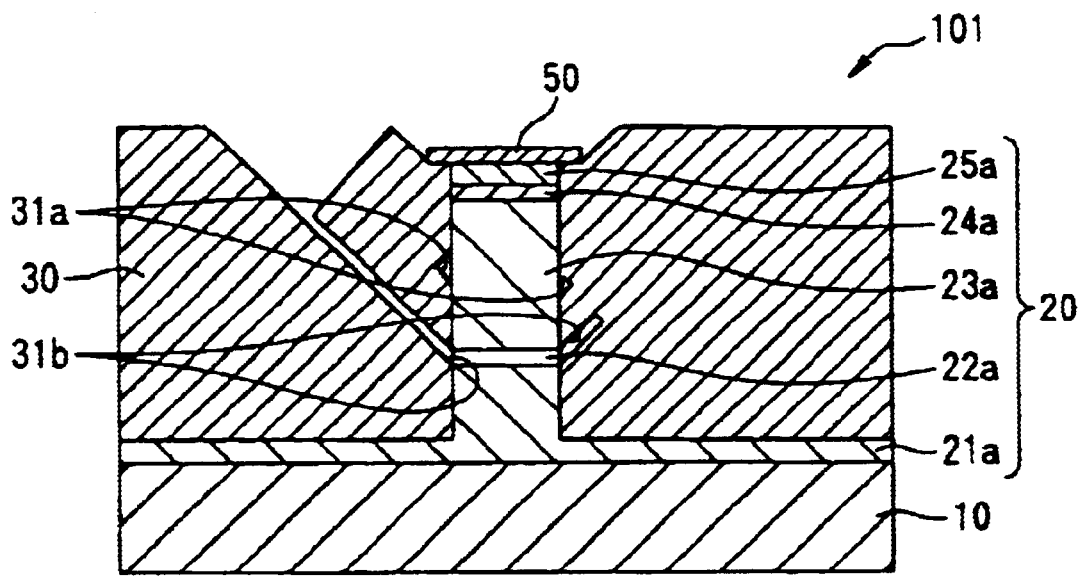
FIG. 3 is a section view of a fabrication process of a semiconductor optical device that uses a conventional compound semiconductor as a burying layer.
Figure 4:
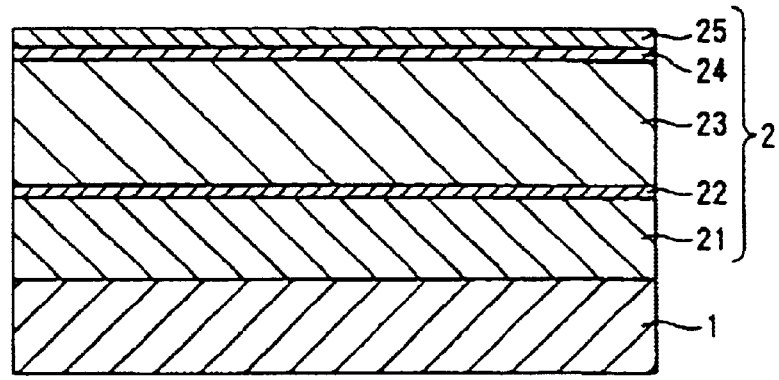
FIGS. 4–9 are section views showing a fabrication method of a semiconductor optical device that uses a Ru-doped compound semiconductor as a burying layer according to a first embodiment of the present invention.

First, as shown in FIG. 4, the n-InP layer 21, the photoabsorption layer 22, the p-InP layer 23, the p-InGaAsP layer 24 and the p-InGaAs contact layer 25 are grown successively on the n-InP semiconductor substrate 1.

The semiconductor stacked body 2 is grown by MOVPE: Metalorganic Vapor Phase Epitaxy, which is known. The method for growth is not limited to the epitaxial growth method, and, MBE: Molecular Beam Epitaxy or LPE: Liquid Phase Epitaxy can be also used, for example.

Figure 5:
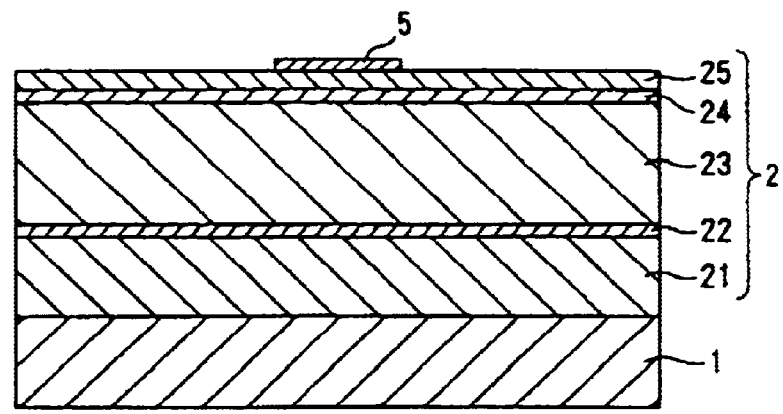
Figure 6:
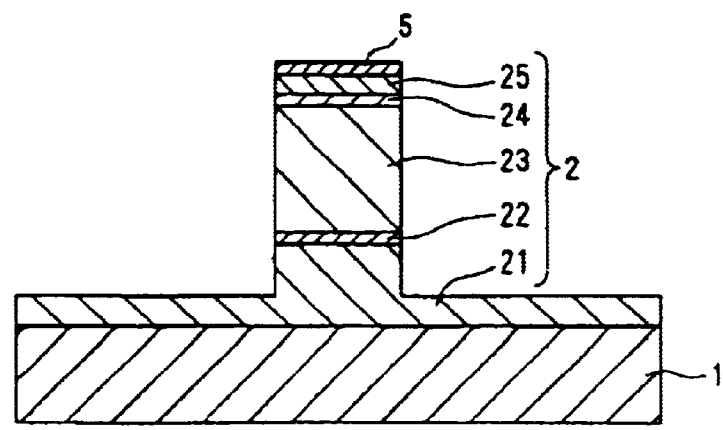
Figure 7:
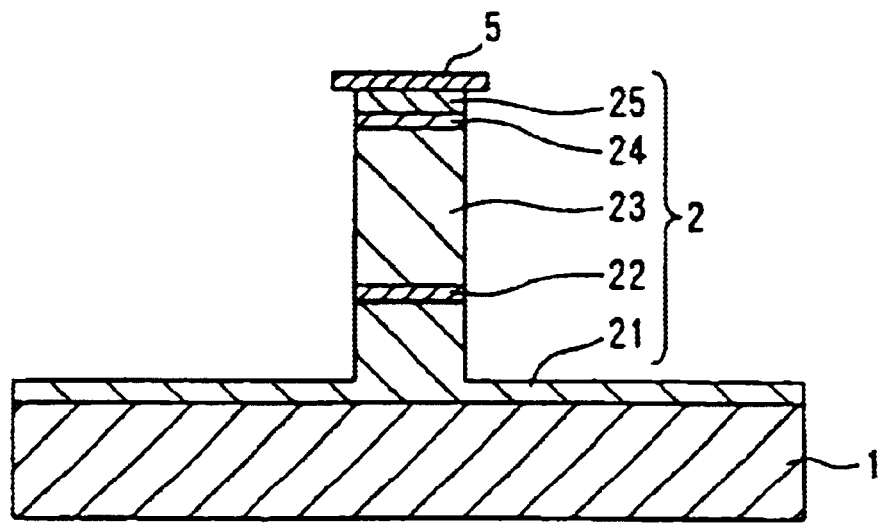

Next, as shown in FIG. 5, a silicon oxidized film ($SiO_2$) is formed as an insulating layer 5 by plasma CVD method or the sputtering method on the p-InGaAs contact layer 25, and a $SiO_2$ mask in the shape of the stripe is left by using photo lithography. As shown in FIG. 6, by using $SiO_2$ as a mask, a vertical mesa stripe structure that is cut about halfway through the n-InP layer 21 by RIE: Reactive Ion Etching is obtained. Then, as shown in FIG. 7, the side surface of the vertical mesa stripe structure and n-InP layer 21 are further etched by using hydrochloric acid and sulfuric acid.

Figure 8:
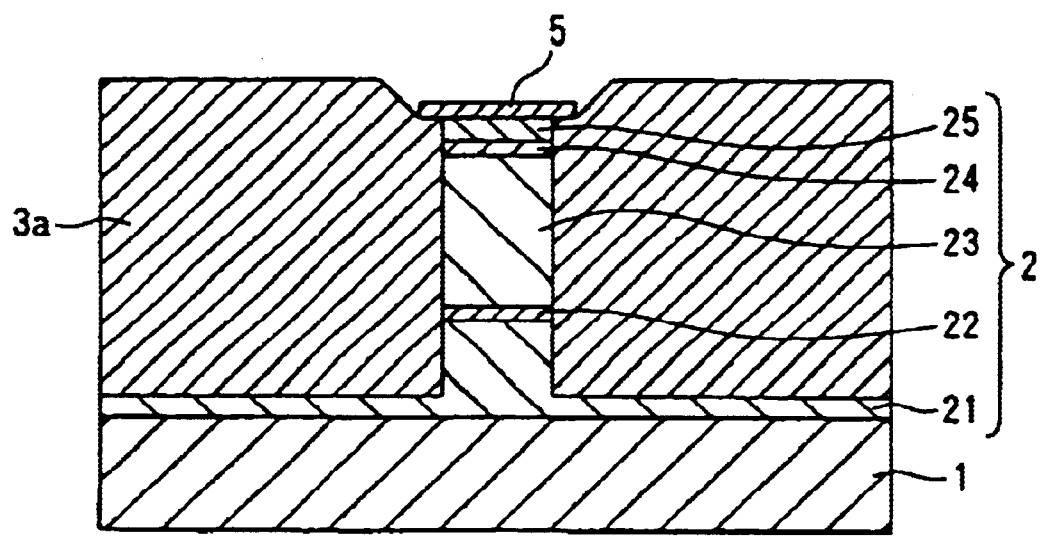

Next, as shown in FIG. 8, the Ru-doped InAlAs layer 3a is grown by using the MOVPE method on the n-InP layer 21, which includes a bottom surface of a ditch region around the vertical mesa stripe structure. In this example, growth temperature is 620° C., growth pressure is 70 torr, V/III ratio for the growth is 100. In this condition, epitaxial growth is performed in which bis dimethylpentadienyl ruthenium, which is a source material for Ru, is bubbled at 20° C., and supplied using the flow rate of 700 sccm.

Next, after removing the $SiO_2$ mask, a photo resist (which is not shown in the figure) is coated on the top surface of the Ru-doped InAlAs layer 3a except for the top surface of the p-InGaAs contact layer 25. By performing patterning on the photo resist by photo lithography, a resist layer of predetermined pattern (not shown in the figure) is formed. Then, as shown in FIG. 9, after a metal layer formed by AuZn/Au is formed on the top surface of the resist layer by using a vacuum deposition method, the metal layer and the resist layer are removed by a liftoff method.

In addition, a metal layer formed by AuGeNi is formed on the bottom surface of the semiconductor substrate 1. The p-electrode 4a is formed on the top surface of the semiconductor stacked body 2 and n-electrode 4b is formed on the bottom surface, so that current flows in the semiconductor stacked body 2 with the vertical mesa stripe structure.

In experiments, high quality burying layer 3 was observed from the section of the electroabsorption modulator 100 with the above-mentioned structure, in which irregular growth such as voids and horned bumps was hardly observed. The resistivity of these burying layers was about $10^9$ $\Omega$ cm, which is higher than that of the burying layer formed by Ru-doped InP. In addition, the growth conditions of the Ru-doped InAlAs layer were changed in ranges of growth temperature 580~640° C., growth pressure 20~150 torr and V/III ratio 10~500. Also in these cases, semi-insulating burying layers without voids and bumps were obtained in good reproducibility in any condition in the ranges indicated above.

In addition, as for the conventional Ru-doped InP burying layer used for burying the mesa stripe with the height of 2 $\mu$m, voids were found in 30% of the semiconductor devices. On the other hand, as for the Ru-doped InAlAs burying layer 3a of the present invention, voids were found only in 1% or less of the semiconductor devices. Thus, it can be understood that fabrication yield is improved according to the present invention.

In addition, leakage current became equal to or below 1 nA for 90% of the devices according to the present invention when reverse bias of 2V is applied. That is, it is understood that the leakage currents can be suppressed according to the present invention.

In the electroabsorption modulator 100 with the above-mentioned structure, by using the Ru-doped InAlAs for the burying layer 3a to bury the ditch region around the vertical mesa stripe structure, inter-diffusion between Zn and Ru can be suppressed even when the Zn-doped p-type cladding layer is placed adjacent to the burying layer 3a. This is because the diffusion rate of Ru in the compound semiconductor crystal is remarkably smaller than that of Fe, and the diffusion rate of impurities in InAlAs is remarkably smaller than that of the conventional InP. Therefore, the resistivity of the burying layer is not lowered, and a highly reliable electroabsorption modulator with suppressed leakage currents can be obtained. By the electroabsorption modulator of this embodiment, extinction of 15 dB at an applied voltage of 1.5V and frequency response of 15 GHz at 3 dB bandwidth were obtained.

In addition, Ru-doped InAlAs is insensitive to surface damage or oxide layer when it grows. Thus, the burying layer 3a without voids and defects can be grown on the surface layer on which dry etching or wet etching is performed for forming the mesa stripe and the like.

In addition, since the binding strength between the doped Ru and As that forms InAlAs is remarkably weaker than that between Ru and P that forms InP, precipitate hardly occurs during growth of the InAlAs crystal. Therefore, since it is not necessary to use very narrow conditions for growth such as for the conventional Ru-doped InP, a semi-insulating semiconductor crystal layer can be grown easily.

Second Embodiment

Figure 10:
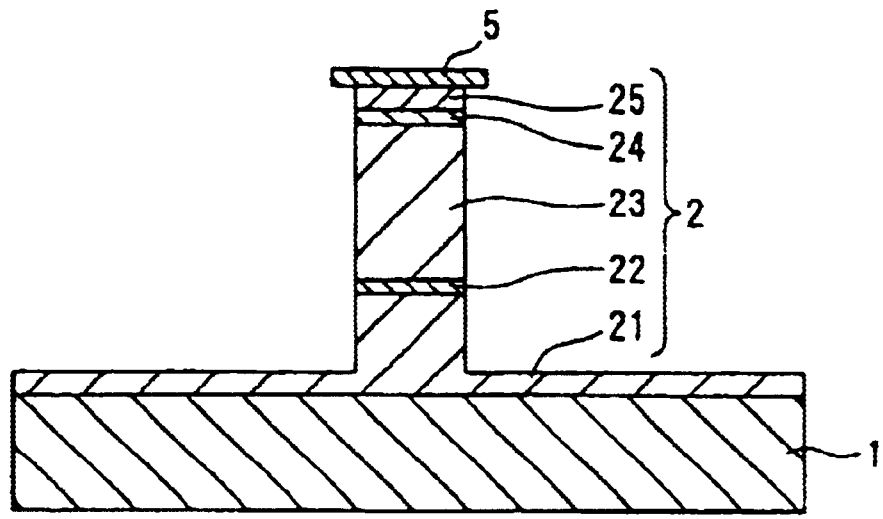
FIGS. 10–12 are section views showing a fabrication method of a semiconductor optical device that uses both of a Ru-doped compound semiconductor and a conventional Ru-doped InP layer as the burying layer according to a second embodiment of the present invention.
Figure 11:
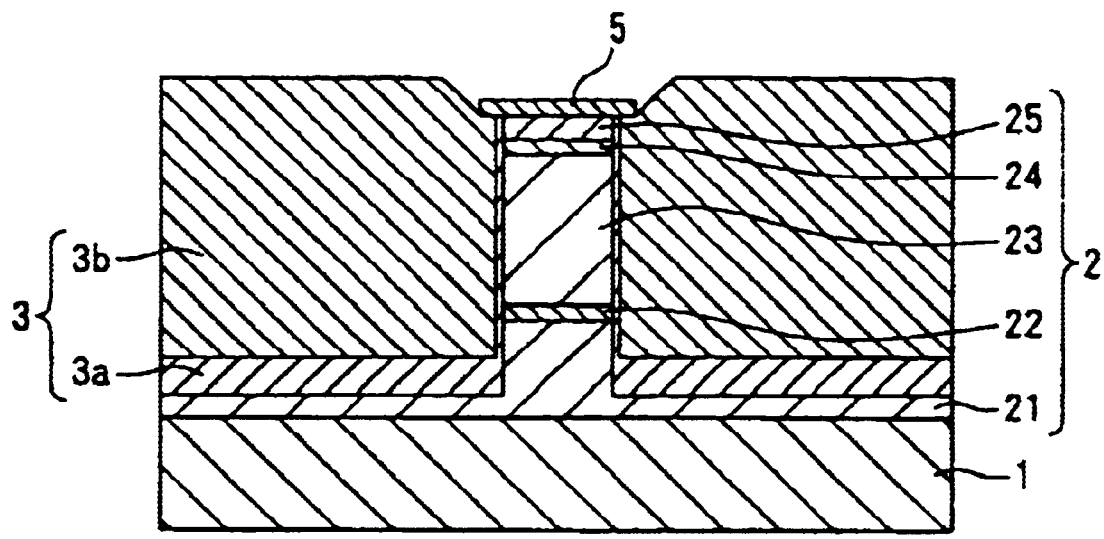
Figure 12:
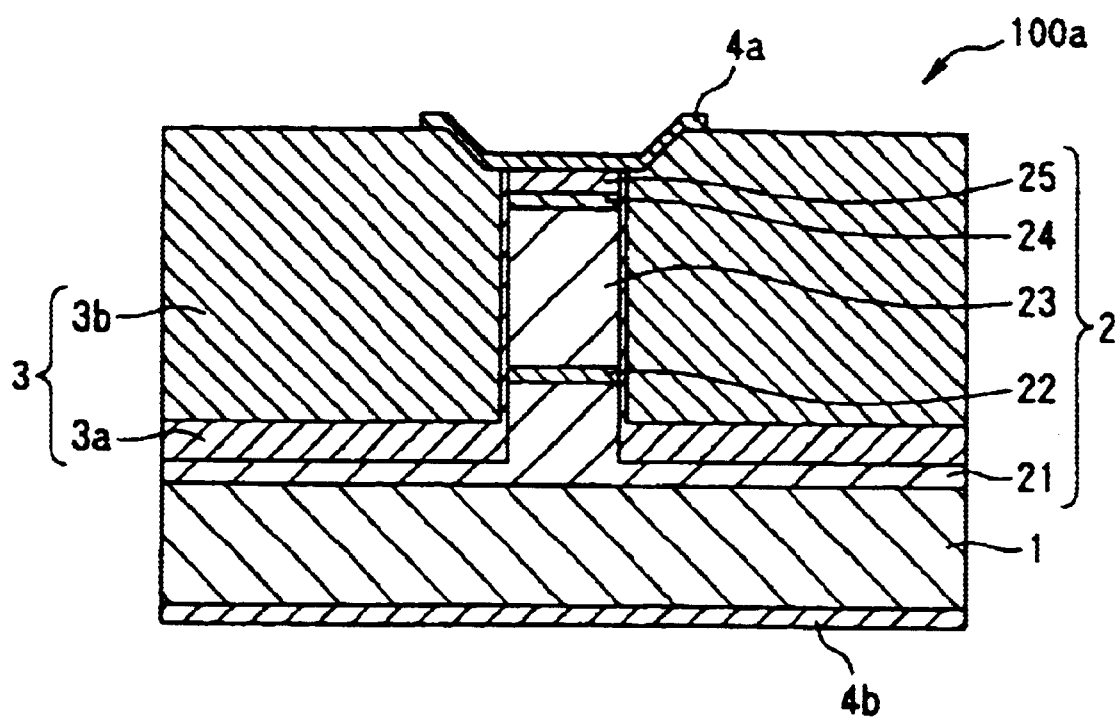

Next, the second embodiment of the present invention will be described with reference to FIGS. 10–12. FIGS. 10–12 are section views for explaining an example of a fabrication process of an optical modulator using both of the Ru-doped compound semiconductor of the present invention and the conventional Ru-doped InP layer as the burying layer.

The electroabsorption modulator 100a of this embodiment has the same structure as the first embodiment. Ru-doped InAlAs layer 3a is used as the compound semiconductor burying the side walls of the mesa stripe structure, and the Ru-doped InP layer 3b is provided on the surface of the Ru-doped InAlAs layer 3a, which is also used in the first embodiment. Trimethylindium, phosphine, bis dimethylpentadienyl ruthenium are used as source materials for the Ru-doped InP layer 3b.

For fabricating this embodiment, after performing fabrication processes shown in FIGS. 4–6, a $SiO_2$ mask 5 is formed on the top surface of p-InGaAs contact layer 25, which is the top layer of the mesa stripe structure. Next, as shown in FIG. 11, after growing a 0.2 μm-thick Ru-doped InAlAs layer, a 2 μm-thick Ru-doped InP layer is grown. In the growth, growth conditions are set such that growth temperature is 580° C., growth pressure is 40 torr, V/III ratio is 200 for the Ru-doped InAlAs and 10 for the Ru-doped InP.

Accordingly, as shown in FIG. 11, the Ru-doped InAlAs layer 3a with the thickness of 0.2 μm is stacked on the side wall of the mesa stripe structure. Therefore, next growth of the Ru-doped InP layer is unaffected by surface damage or an oxide layer.

After that, by using the same method as that of the first embodiment, the p-electrode 4a and n-electrode 4b are formed as shown in FIG. 12, so that the fabrication of the electroabsorption modulator 100a is completed.

High quality burying layers 3 were observed from the section of the electroabsorption modulator 100a with the above-mentioned structure. That is, irregular growth such as voids and horned bumps were hardly observed. The ratio of the number of devices with voids to the total devices was 2% or below. Voids do not occur during growth of the Ru-doped InAlAs layer since the Ru-doped InP layer 3b is grown just after growing the Ru-doped InAlAs layer 3a. Even if the Ru-doped InAlAs layer is very thin, it is possible to form the burying layer 3 with no voids.

In addition, since the Ru-doped InAlAs layer 3a is stacked first, and, after that, the Ru-doped InP layer 3b is stacked on the top surface of the Ru-doped InAlAs layer 3a, a layer including Al is not exposed on the surface. Therefore, the present invention is effective for fabricating integrated modulators with other devices such as a monolithically integrated laser diode, photodiode and modulator.

Third Embodiment

Next, the third embodiment of the present invention will be described with reference to FIGS. 13–18. FIGS. 13–18 are section views for explaining an example of a fabrication process of an optical modulator using both of the Ru-doped compound semiconductor of the present invention and the conventional Fe-doped InP layer as the burying layer.

The semiconductor laser diode 100A of this embodiment includes a p-InP semiconductor substrate 1A, a semiconductor stacked body 2A with a light emitting region provided on the top surface of the semiconductor substrate 1A, a compound semiconductor 3 to bury so as to surround the light emitting region, an n-electrode 4B provided on the top surface, and a p-electrode 4A provided on the bottom surface of the semiconductor substrate 1A.

The semiconductor stacked body 2A includes a 0.5 μm-thick p-InP cladding layer 21A, a 0.1 μm-thick non-doped InGaAsP layer 22A, a 0.1 μm-thick nondoped InGaAsP layer 23A, a 0.1 μm-thick nondoped InGaAsP layer 24A, a 0.5 μm-thick n-InP cladding layer 25A and a 0.1 μm-thick n-InGaAsP layer 26A and a 0.3 μm-thick contact layer 27A formed by n-InGaAs.

In the semiconductor stacked body 2A, a concave ditch region is formed around the mesa stripe. In the ditch region, a Ru-doped InAlAs layer 3A and a Fe-doped InP layer 3B on the top of the InAlAs layer 3A are buried. Source materials for the InAlAs layer 3A and InP layer 3B, and source materials for the p-electrode 4A and n-electrode 4B are the same as those of the first embodiment.

Figure 13:
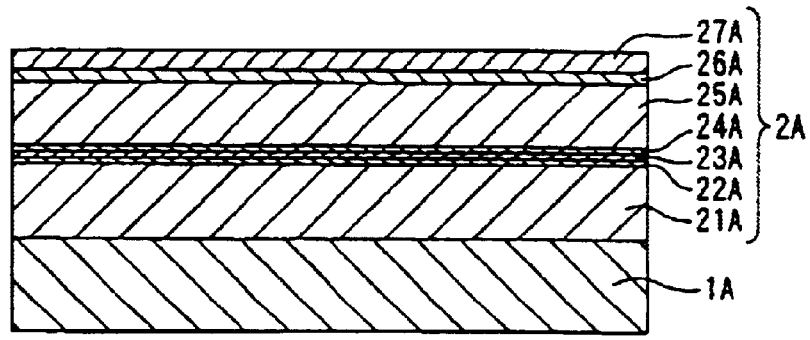
FIGS. 13–18 are section views showing a fabrication method of a semiconductor laser diode that uses both of a Ru-doped compound semiconductor and a conventional Fe-doped InP layer as the burying layer according to a third embodiment of the present invention.
Figure 14:
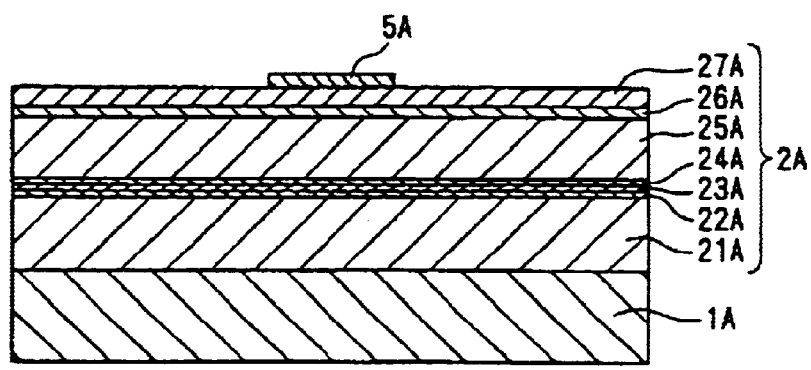
Figure 15:
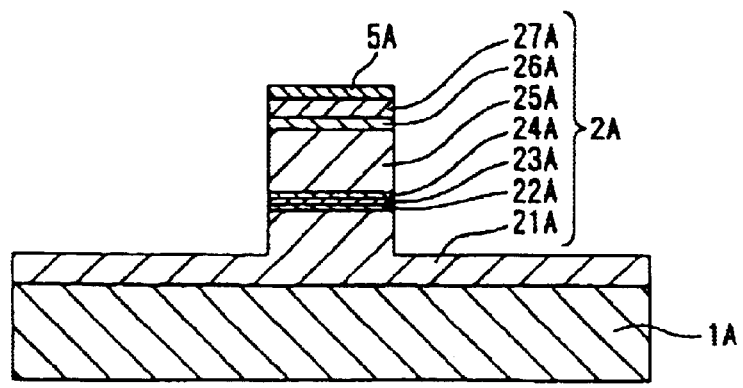
Figure 16:
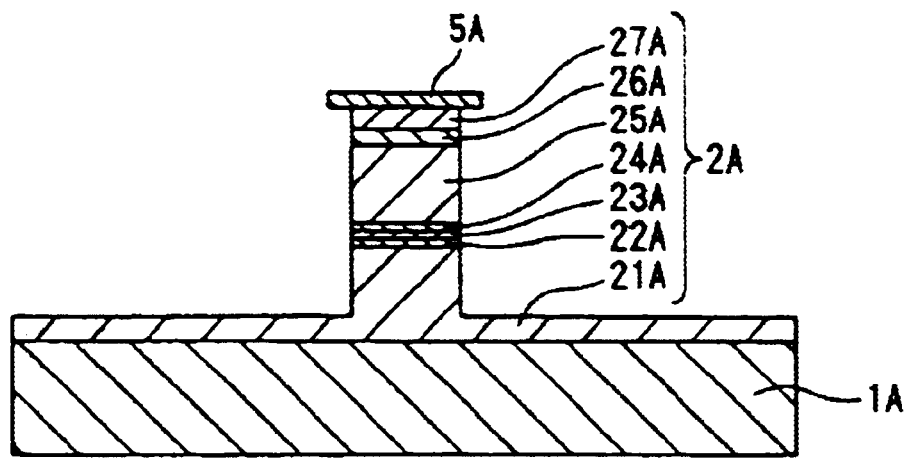
Figure 17:
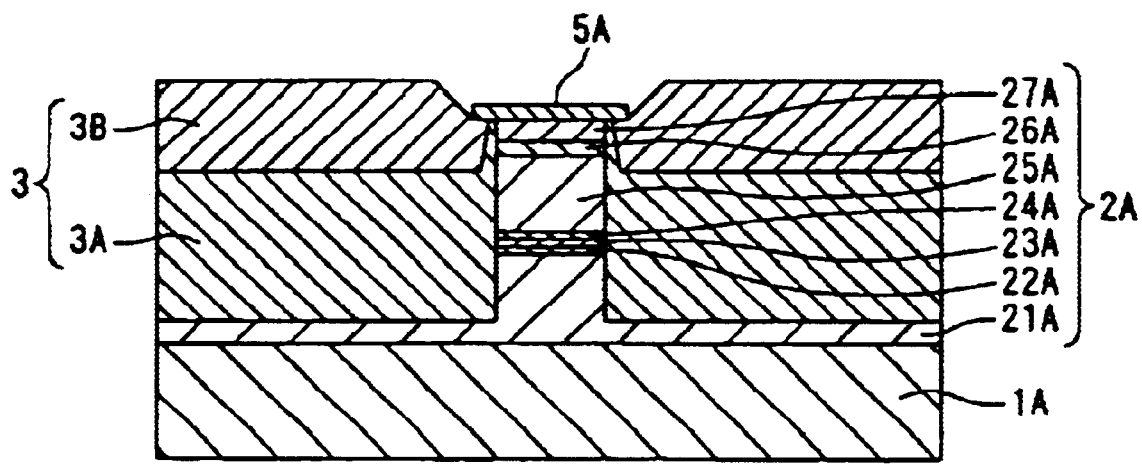
Figure 18:
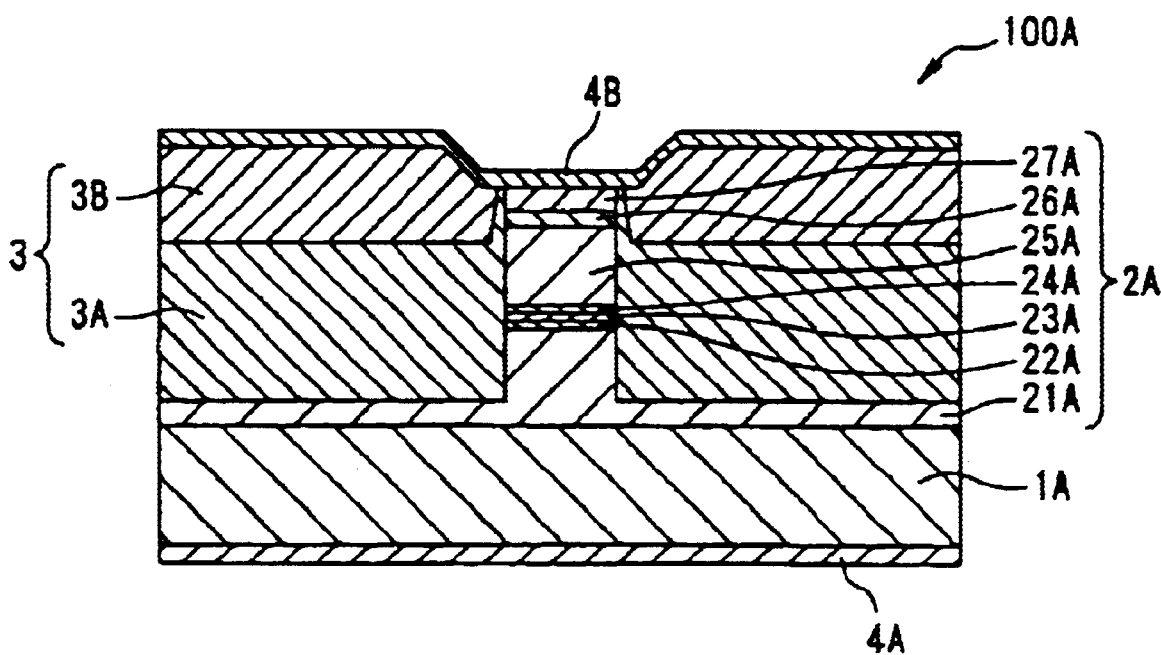

For fabricating the semiconductor laser diode 100A of this embodiment, a mesa stripe structure is formed in the semiconductor stacked body 2A, which is grown on the semiconductor substrate 1A as shown in FIGS. 13–15 first in the same way as the first and second embodiments. Next, as shown in FIG. 16, a $SiO_2$ mask 5A is formed on an n-InGaAs contact layer 27A, which is the top layer of the mesa stripe.

After that, the Ru-doped InAlAs layer 3A is grown on the bottom surface of the ditch region formed around the mesa stripe structure by using the MOVPE method. Growth conditions are set such that growth temperature is 620° C., growth pressure is 100 torr, and V/III ratio is 100. The bis dimethylpentadienyl ruthenium is bubbled at 20° C., and flowed by the flow rate of 1000 sccm. In addition, a Fe-doped InP layer 3B is grown on the top surface. Dicyclopentadienyl iron (ferrocene) is used as the source material for Fe.

Then, after removing the $SiO_2$ mask 5A, the n-electrode 4B is formed on the top surface of the stacked body and the burying layer 3, and the p-electrode 4A is formed on the bottom surface of the semiconductor substrate 1A, so that fabrication of the semiconductor laser diode 100A of this embodiment is completed.

In the semiconductor laser diode 100A of the above-mentioned structure, growth conditions were changed in ranges in which growth temperature was 580~640° C., growth pressure was 20~150 torr, and V/III ratio was 10~500. As a result, a high quality burying layer 3 in which irregular growth such as voids and bumps was hardly observed was obtained with good reproducibility in any range. Therefore, it can be understood that it becomes possible to be able to form a high-power laser diode with small leakage currents.

In addition, the active layer of the semiconductor laser diode 100A is formed by the InAlAs—InGaAlAs multiple quantum well layer, and the side walls are buried. In this structure, voids do not occur on the side walls of the active layer, so that the semiconductor laser diode 100A with high performance and high reliability can be obtained.

In addition, even though the Fe-doped InP layer 3B is stacked on the top surface of the Ru-doped InAlAs layer 3A, it becomes possible to realize the semiconductor laser diode 100A with high performance and small leakage current.

In the first to third embodiments, a Ru-doped InAlAs is used as the compound semiconductor. However, the compound semiconductor is not limited to InAlAs. For example, InGaAlAs can be used as the compound semiconductor and the same effect can be obtained. Especially, by changing composition of Ga and Al in InGaAlAs, the physical constants of refractive index and bandgap and the like can be changed while keeping lattice matching between InGaAlAs and the InP substrate. Thus, it becomes possible to adjust the propagation mode of light.

In addition, in the first through third embodiments, the electroabsorption modulator and semiconductor laser diode are used for the semiconductor optical device. However, the semiconductor optical device is not limited to these. The present invention can be applied to other semiconductor optical devices such as a semiconductor optical amplifier and a waveguide photodiode.

In addition, the MQW layer formed by InAlAs—InGaAlAs is used for the multiple quantum well layer in the embodiment. However, the present invention is effective for InGaAsP—InGaAs(P)MQW, structures of bulk layers or multiple quantum well layers and the like in all systems using InP as the substrate such as an InGaAs(P) bulk layer and the like.

As mentioned above, according to the compound semiconductor of the embodiments, it becomes possible to obtain a high quality semiconductor crystal layer that hardly causes increase of leakage currents and hardly includes voids without restricting growth conditions.

As mentioned above, according to the semiconductor optical device of this embodiment, by using the above-mentioned compound semiconductor layer as the burying layer, it becomes possible to obtain a high quality semiconductor optical device that hardly causes increase of leakage currents, hardly includes voids and defects and has good reproducibility, such as a semiconductor optical amplifier and a waveguide photodiode, for example.

Fourth Embodiment

Figure 19:
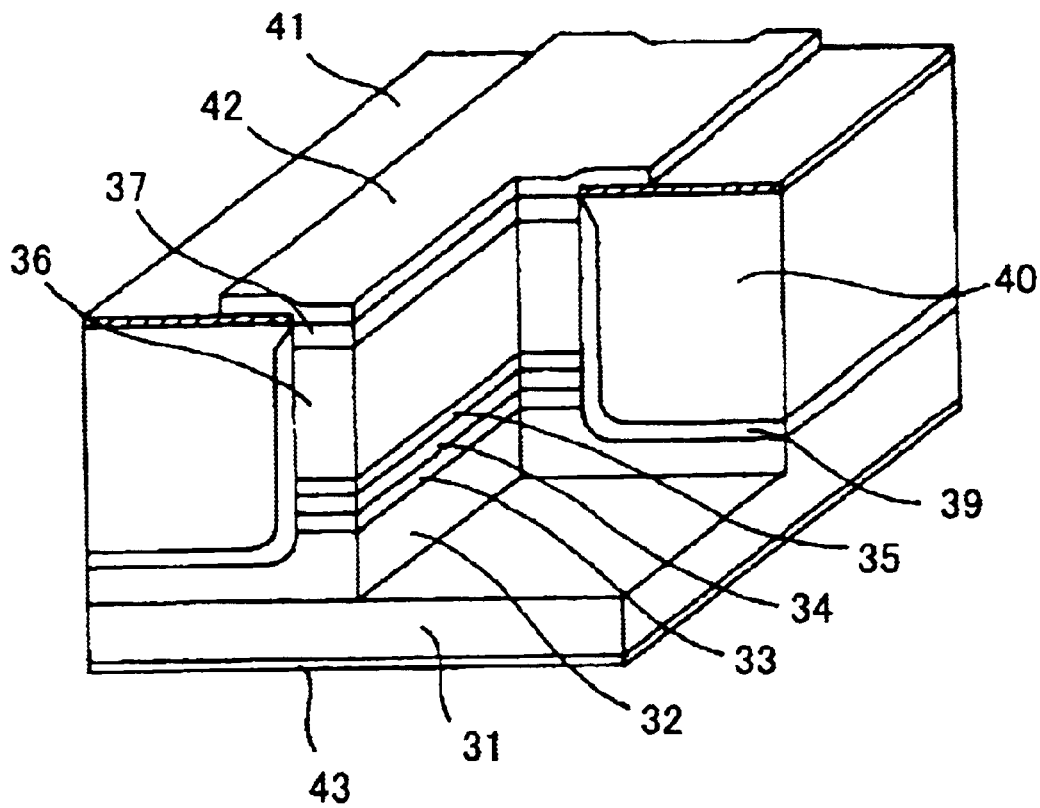
FIG. 19 is a section perspective view showing a structure of an electroabsorption modulator of a fourth embodiment of the present invention.

In the following, a fourth embodiment of the present invention will be described. FIG. 19 shows a buried structure semiconductor optical device of the fourth embodiment of the present invention. This embodiment is an electroabsorption modulator (EA modulator) using MQW as the photoabsorption layer.

Stacked on a (100) oriented n-InP substrate 31 are a 0.2 $\mu$m-thick Se-doped n-InP cladding layer 32, a 40 nm-thick nondoped InGaAsP guide layer 33 (composition wavelength 1.3 $\mu$m), a nondoped InGaAlAs/InAlAs strained MQW (multiple quantum well) photoabsorption layer 34 (0.15 $\mu$m-thick, wavelength of absorption edge 1.50 $\mu$m), a 40 $\mu$m-thick nondoped InGaAsP guide layer 35 (composition wavelength 1.3 $\mu$m), a Zn-doped p-InP cladding layer 36, and a 0.3 $\mu$m-thick Zn-doped p-InGaAs contact layer 37 in this order.

Except for the photoabsorption layer 34, the compound semiconductor layers are formed such that lattice matching with the InP substrate 1 is satisfied except where specifically noted. In the figure, the reference numeral 38 indicates a $SiO_2$ mask, 41 indicates a $SiO_2$ passivation film, 42 indicates a p-electrode and 43 indicates an n-electrode.

This stacked body is processed to form like mesa stripe with 2 $\mu$m width and 3 $\mu$m height. In addition, the both sides are buried by the Ru-doped InP layer 39 and the Fe-doped InP layer 40. This structure is different from a conventional example in that a Ru-doped InP layer 39 is inserted as a diffusion preventing layer. In addition, this embodiment is different from the third embodiment in that the Ru-doped InP layer is used as the diffusion preventing layer.

The thickness of the Ru-doped InP layer 39 is from 0.05 $\mu$m to 0.5 $\mu$m, desirably 0.1 $\mu$m. In addition, it is desirable that the doping concentration of the Ru is enough for the Ru-doped InP to become semi-insulating. Further, the diffusion preventing layer is not limited to the Ru-doped InP. The same effect can be obtained also by using an alloy semiconductor crystal, such as Ru-doped InGaAlAs, InAlAs, InGaAsP and the like, with a compound that is lattice-matched to the substrate.

In the following, a specific example will be described.

In order to verify the effect of the embodiment, the present invention was compared with examples 1 and 2 with the different buried structures. In the comparison example 1, the mesa stripe is buried only with polyimide. In the comparison example 2, the mesa stripe is buried only with the Fe-doped InP layer.

Figure 20A:
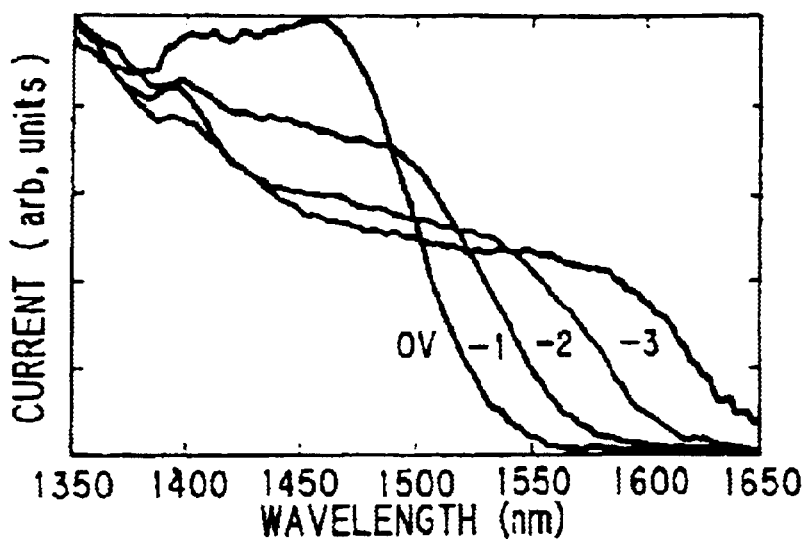
FIGS. 20A–20C indicate photocurrent spectrums of comparison examples 1 and 2 and the electroabsorption modulator of the fourth embodiment.
Figure 20B:
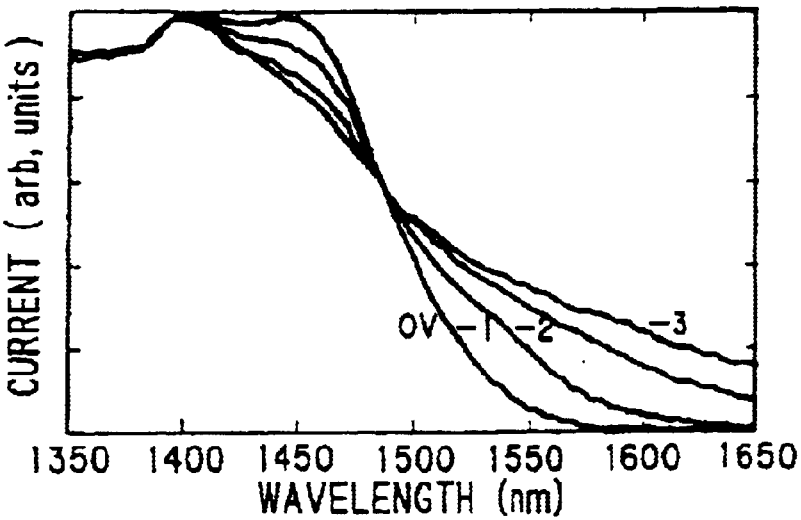
Figure 20C:
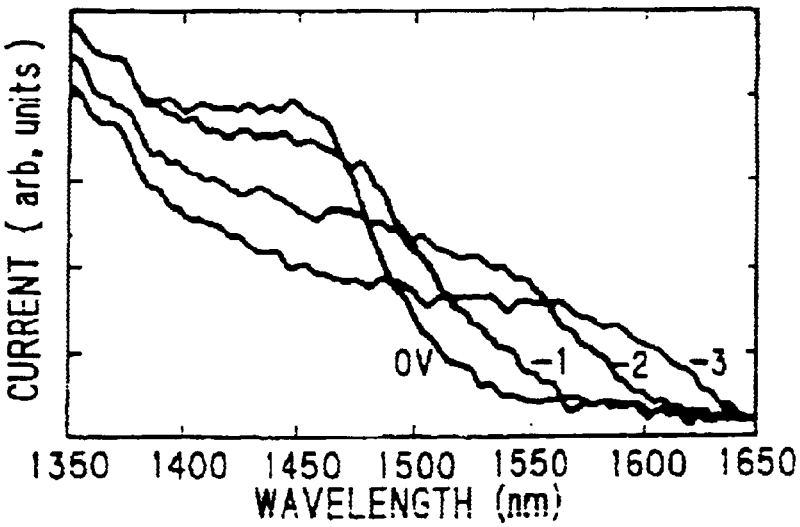

FIGS. 20A–20C indicate photocurrent spectrums of the comparison examples 1 and 2 and the electroabsorption modulator in the present invention. FIG. 20A, FIG. 20B, FIG. 20C indicates spectrums for the comparison examples 1 and 2, and the present invention respectively. The parameter is voltage applied to the device. The incident light is TM mode.

As for the comparison example 1, as shown in FIG. 20A, clear exciton absorption can be observed. In addition, it can be recognized that the edge of absorption shifts to the side of the long wavelength as the applied bias increases. This indicates an almost ideal quantum confined Stark effect (QCSE).

In the case of the comparison example 2, as shown in FIG. 20B, the clear exciton absorption is not observed, and the shift of the absorption edge with the increase of the applied bias is not observed. As shown in FIG. 20B, only absorption of the side of the long wavelength is relatively increased. This indicates that the device characteristics deteriorate due to diffusion of Fe from the Fe-doped InP layer to the mesa stripe. That is, Fe atoms that diffuse in the p-InP cladding layer push Zn atoms to an interstitial site, and the Zn atoms at the interstitial site diffuse in the photoabsorption layer, so that the device characteristics deteriorate.

As for this embodiment, as shown in FIG. 20C, although the exciton absorption is not clear, the shift of the absorption edge associated with increase of applied bias is clearly shown. The reason why the device characteristics do not deteriorate, which is different from the comparison example 2, is that the Ru-doped InP layer is inserted between the mesa stripe and the Fe-doped InP layer so that diffusion of Fe from the Fe-doped InP layer to the mesa stripe is prevented.

Next, device capacitances of the electroabsorption modulator are compared. In comparing device capacitances, devices having the same width and height for the mesa stripe and the same device length were compared.

The device capacitance of the comparison example 1 is 5 pF, and device capacitance of the comparison example 2 is 10 pF. The reason why the device capacitance is larger than that of the comparison example 1 is described as follows.

Zn atoms diffuse to the Fe-doped InP layer due to inter-diffusion between Zn and Fe since the p-InP cladding layer and p-InGaAs contact layer that form the mesa stripe are placed adjacent to the Fe-doped InP layer. That is, as Zn atoms diffuse, the Fe-doped InP layer is changed to be p type, so that the device capacitance increases. However, since Zn diffusion does not occur in the comparison example 1, the device capacitance remains low. On the other hand, the device capacitance of the electroabsorption modulator of the present invention is 6 pF, which is almost the same as that of the comparison example 1.

Therefore, it can be understood that diffusion of Zn to the Fe-doped InP layer does not occur. That is, since the Ru-doped InP layer is inserted between the mesa stripe and the Fe-doped InP layer, Zn diffusion to the Fe-doped InP layer is prevented.

Figure 21:
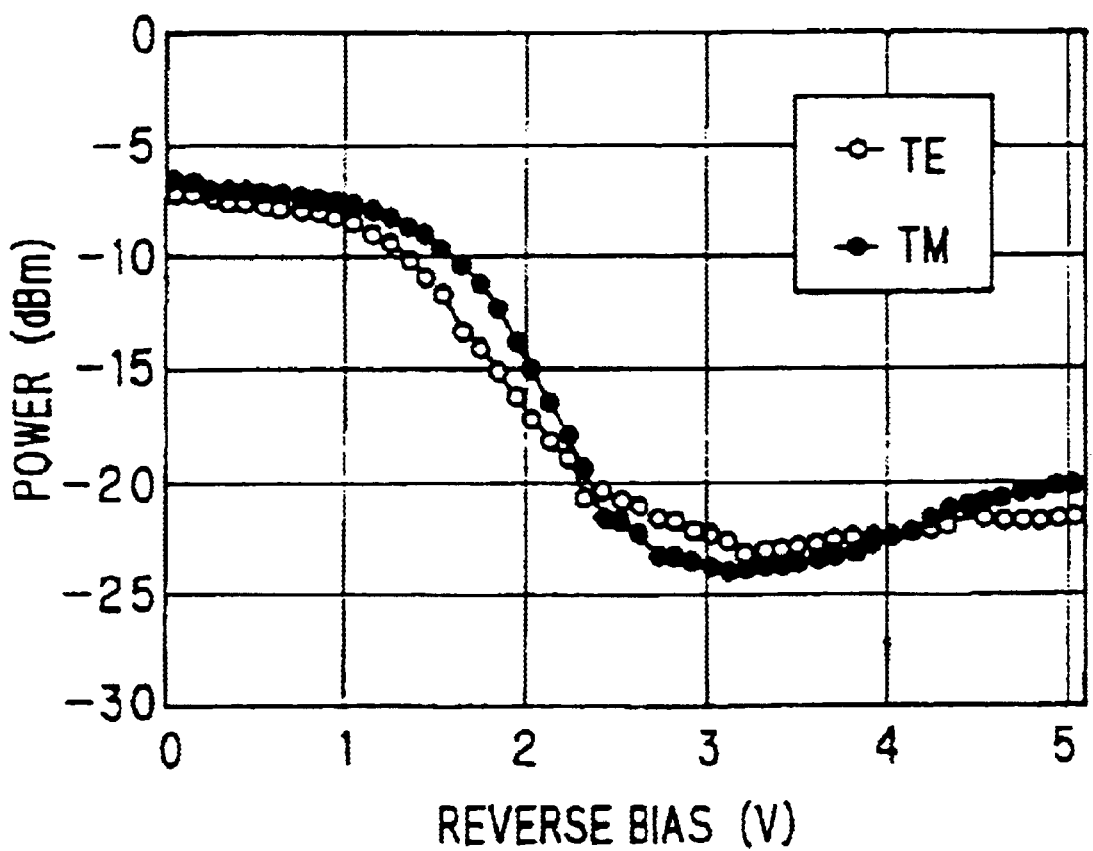
FIG. 21 shows the relationship between the applied bias and the power intensity of transmitted light from the electroabsorption modulator of the fourth embodiment of the present invention.

FIG. 21 shows a relationship between the applied bias and transmission optical power intensity of the electroabsorption modulator of the present invention.

In the figure, two cases in which the incident light is TE mode and TM mode are shown. The wavelength of the incident light is 1.55 $\mu$m. When the applied bias is 0, the power losses of the transmitted light are 6.6 dB and 7.3 dB for TE mode and TM mode respectively.

As shown in FIG. 21, as the applied bias increases, the intensity decreases for the two modes, and difference of the intensity between the two modes is equal to or less than 1 dB.

Figure 22A:
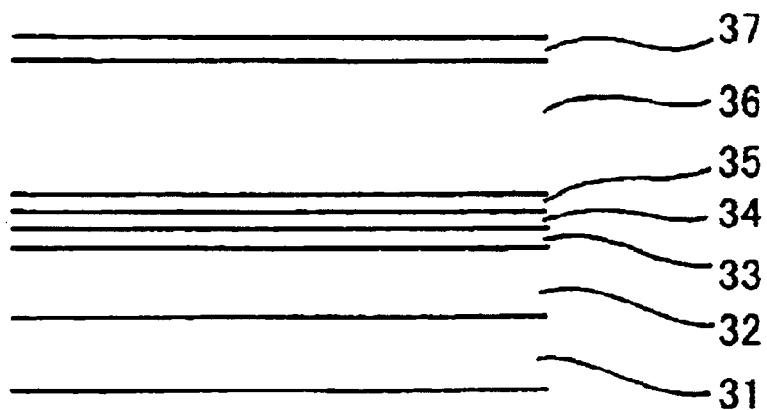
FIGS. 22A–22C are figures for explaining a fabrication method of the electroabsorption modulator of the fourth embodiment.
Figure 22B:
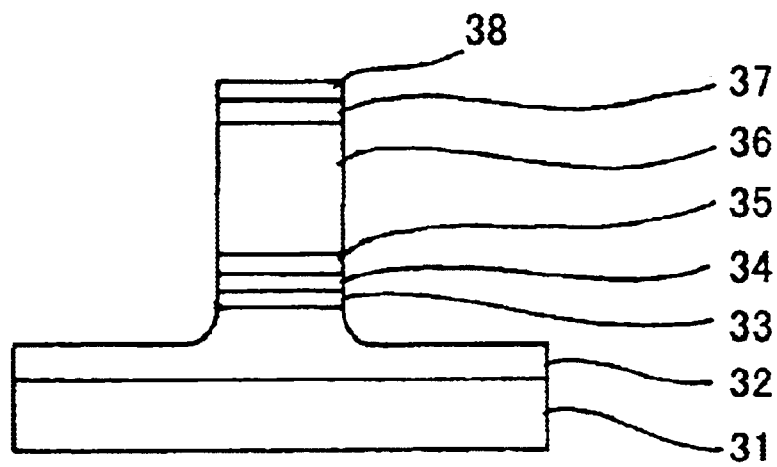
Figure 22C:
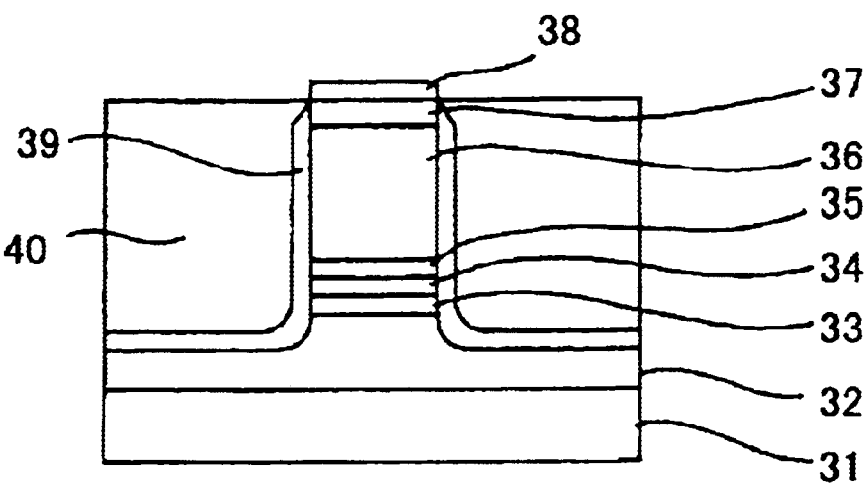

FIGS. 22A–22C are figures for explaining a fabrication method of the electroabsorption modulator of the embodiment. First, as shown in FIG. 22A, stacked on a (100) oriented n-InP substrate 31 are a 0.2 $\mu$m-thick Se-doped n-InP cladding layer 32, a 40 nm-thick nondoped InGaAsP guide layer 33 (composition wavelength 1.3 $\mu$m), a non-doped InGaAlAs/InAlAs strained MQW (multiple quantum well) photoabsorption layer 34 (0.15 $\mu$m-thick, wavelength of absorption edge 1.50 $\mu$m), a 40 nm-thick nondoped InGaAsP guide layer 35 (composition wavelength 1.3 $\mu$m), a Zn-doped p-InP cladding layer 36, and a 0.3 $\mu$m-thick Zn-doped p-InGaAs contact layer 37 in this order.

Except for the photoabsorption layer 34, the compound semiconductor layers are formed such that lattice matching with the InP substrate 1 is satisfied except where specifically noted.

Next, as shown in FIG. 22B, the mesa stripe of about 2 $\mu$m width and 3 $\mu$m height is formed by reactive ion etching (RIE) by using SiO$_2$ 38 as a mask. Next, as shown in FIG. 22C, the Ru-doped InP layer 39 and the Fe-doped InP layer 40 (3 $\mu$m-thick) are grown on the substrate on which the mesa stripe is formed by using the MOVPE method.

For growing the Ru-doped InP layer 39, bis($\eta$5-2,4-dimethylpentadienyl)ruthenium(II) is used as the source material for Ru. The growth temperature is 580° C.–640° C., typically 600° C. The layer thickness is controlled by the growth time.

For growing the Fe-doped InP layer 40, ferrocene (Cp$_2$Fe) is used as the source material for Fe. The growth temperature in this case is the same as that of the Ru-doped InP.

After that, as shown in FIG. 19, the SiO$_2$ mask is removed and SiO$_2$ passivation film 41 is formed on the surface other than the region just above the mesa stripe. After that, the p-electrode 42 is formed, and n-electrode 43 is formed on the substrate side.

As mentioned above, this embodiment allows for enhanced performance of the semiconductor optical device buried by the Fe-doped InP, in which the Ru-doped layer is provided between the Fe-doped InP layer and the mesa stripe. Accordingly, an impurity such as Zn atoms and the like doped in the p-layer forming the mesa stripe can be prevented from diffusing to the Fe-doped InP layer or the active region. In addition, at the same time, leakage currents between the mesa stripe and the Fe-doped InP layer can be suppressed.

As mentioned in detail, according to the embodiment, since the Ru-doped layer is inserted between the mesa stripe and the Fe-doped InP layer as the Fe diffusion preventing layer, the semi-insulating impurity such as Fe atoms and the like does not diffuse to the mesa stripe from the Fe-doped InP layer. Therefore, resistivity of the Fe-doped InP layer is not lowered, and an impurity such as Zn atoms doped in the layer forming the mesa stripe does not diffuse to the Fe-doped InP layer or to the active layer or to the photoabsorption layer. In addition, since the Ru-doped layer becomes a semi-insulating crystal, leakage current paths do not occur between the mesa stripe and the Fe-doped InP layer. In addition, since growth temperature of the Ru-doped layer can be the same or lower than that of the Fe-doped InP layer, thermal degradation does not occur on the side walls of the mesa stripe during growth of the burying layer.

Fifth Embodiment

Figure 23:
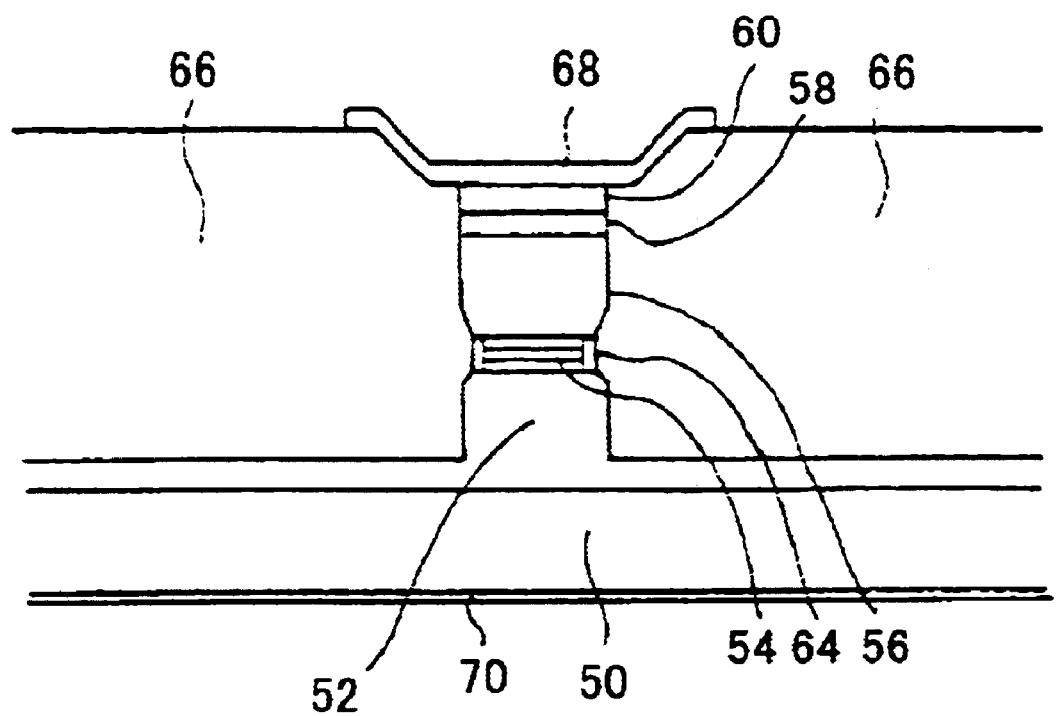
FIG. 23 is a section view showing a structure of an electroabsorption modulator of a fifth embodiment of the present invention.

Next, the fifth embodiment of the present invention will be described. FIG. 23 shows the structure of the optical modulator according to this embodiment. This embodiment is an electroabsorption modulator (EA modulator) using InGaAlAs/InAlAs-MQW as the photoabsorption layer. In this embodiment, a method for fabricating the electroabsorption modulator by using mass transport will be described.

As shown in FIG. 23, stacked on the n-InP substrate 50 are an 1 $\mu$m-thick n-InP cladding layer 52, a photoabsorption layer 54, an 1.5 $\mu$m-thick P-InP cladding layer 56, a 0.1 $\mu$m-thick p-InGaAsP contact layer 58 (composition wavelength 1.3 $\mu$m) and a 0.3 $\mu$m-thick p-InGaAs contact layer 60 in this order.

Each compound semiconductor layer is formed such that lattice matching with the InP substrate is satisfied except where specifically noted.

The photoabsorption layer 54 is formed by, from the bottom, a 40 nm-thick nondoped InGaAsP layer (composition wavelength 1.3 $\mu$m), a MQW layer consisted of 6 pairs of InGaAs well layer (compressive strain of 0.5%, layer thickness 5 nm) and an InAlAs barrier layer (tensile strain of 0.4%, layer thickness 11 nm), and a 40 nm-thick nondoped InGaAsP layer (composition wavelength 1.3 $\mu$m).

This stacked body is processed into a mesa stripe and both side regions are buried with a semi-insulating InP burying layer 66. In addition, an n-electrode 70 of AuGeNi is formed on the back side of the n-InP substrate 10, and a p-stripe electrode 68 of AuZn/Au is formed on the p-InGaAs contact layer 60.

This structure is different from the conventional burying structure optical device in that the width of the photoabsorption layer 54 is narrower than that of the cladding layer, that is, both sides of the photoabsorption layer are positioned in the inside of the horizontal position of the side walls of the mesa stripe, and the Ru-doped InP layer 64 is provided in the inside space of this structure. By adopting this structure, pn junctions are not formed on both sides of the photoabsorption layer, so that increase of capacitance, which was the conventional problem, does not occur. In addition, leakage currents do not increase.

In the above-mentioned structure, the substrate is not limited to n-InP, as a semi-insulating InP substrate or a p-InP substrate are also available. When using the semi-insulating InP substrate, the n-electrode is not formed on the back side of the substrate, but it is necessary to form the substrate such that it connects to the n-InP cladding layer 52 electronically.

When using a p-InP substrate, stacked on the p-InP substrate are an 1 μm-thick p-InP cladding layer, a photoabsorption layer, an 1.5 μm-thick n-InP cladding layer, a 0.1 μm-thick n-InGaAsP (composition wavelength 1.3 μm) contact layer, and a 0.3 μm-thick n-InGaAs contact layer.

The structure of the photoabsorption layer may be the same as that on the n-InP substrate. Then, an AuZn/Au p-electrode is formed on the back surface of the substrate, and an AuGeNi n-stripe electrode is formed on the n-InGaAs contact layer.

Next, the fabrication process of the electroabsorption modulator will be described.

Figure 24A:
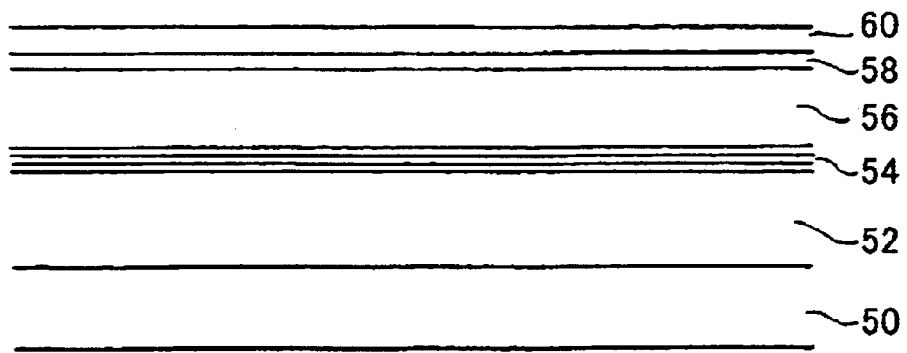
FIGS. 24A–24C are figures for explaining a fabrication method of the electroabsorption modulator of the fifth embodiment.

As shown in FIG. 24A, the 1 μm-thick n-InP cladding layer 52, the photoabsorption layer 54, the 1.5 μm-thick p-InP cladding layer 56, the 0.1 μm-thick p-InGaAsP (composition wavelength 1.3 μm) contact layer 58, and the 0.3 μm-thick p-InGaAs contact layer 60 are grown in this order on the n-InP substrate 50 by using the MOVPE method. Each compound semiconductor has composition lattice-matched to the InP substrate except where specifically noted.

The photoabsorption layer 54 includes a 40 nm-thick nondoped InGaAsP layer (composition wavelength 1.3 μm), a MQW layer consisted of 6 pairs of InGaAlAs well layer of (compressive strain of 0.5%, 5 nm thick), an InAlAs barrier layer (tensile strain of 0.4%, 11 nm-thick), and a 40 nm-thick nondoped InGaAsP layer (composition wavelength 1.3 μm). Source materials for the compound semiconductor forming this layer are trimethylindium, triethylgallium, trimethylaluminum, diethylzinc, phosphine, arsine and silane.

Figure 24B:
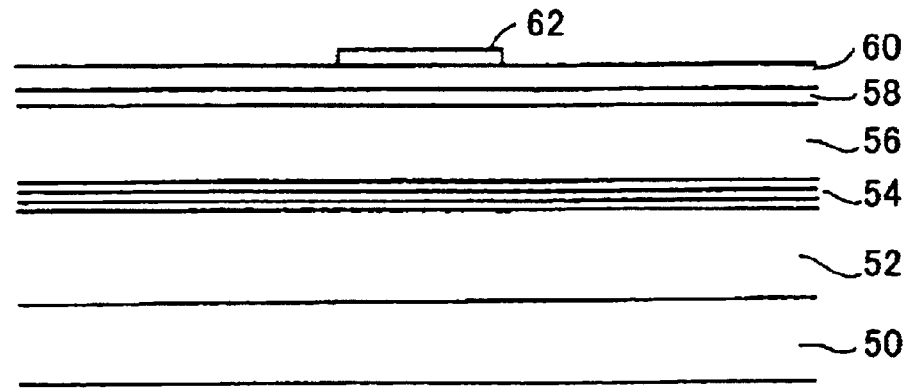
Figure 24C:
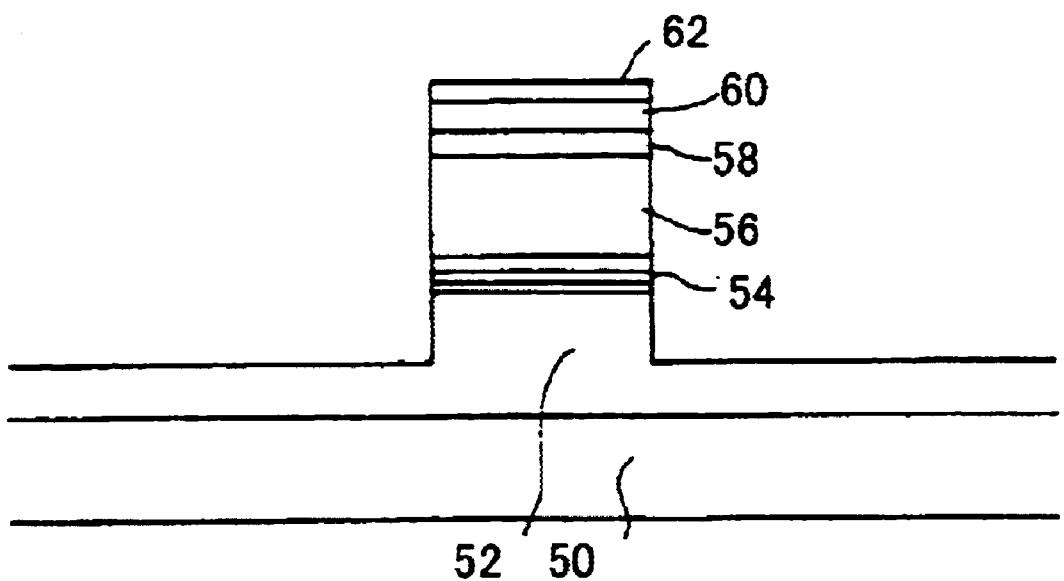

Next as shown in FIG. 24B, a dielectric film such as $SiO_2$ and the like is formed on the p-InGaAs contact layer 20 by using a plasma CVD method and a sputter method, and dielectric film is processed like a stripe by a normal photo lithography, so that a dielectric mask 62 is formed. Then, as shown in FIG. 24C, the vertical mesa stripe is formed by reactive ion etching.

In addition, side walls of the InP layers 52 and 56 are etched by hydrochloric acid. In addition, side walls of the photoabsorption layer 54 and the contact layers 58 and 60 are etched by using a sulfuric acid etching reagent (for example, mixed reagent of sulfuric acid:hydrogen peroxide:water=3:1:1) at room temperature.

Figure 25A:
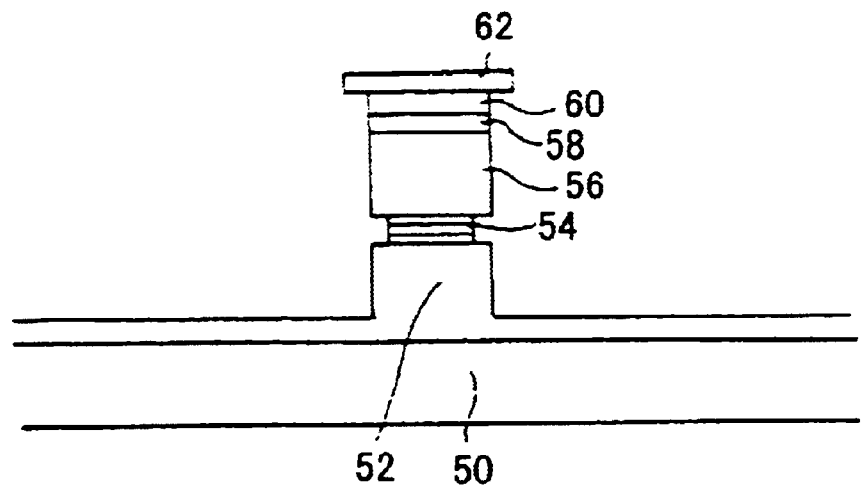
FIGS. 25A–25C are figures for explaining a fabrication method of the electroabsorption modulator of the fifth embodiment.

By using the etching reagent for etching the material selectively, the photoabsorption layer 54 can be processed such that the width of the photoabsorption layer 54 is narrower than that of the cladding layer as shown in FIG. 25A. In addition, by performing etching, a degraded layer of the side surface of the mesa stripe and damage due to processing can be removed.

Next, the mesa stripe is loaded in an MOVPE growth reactor, and the mesa stripe is heated while supplying hydrogen and phosphine. In addition, from 500° C., bis(η5-2,4-dimethylpentadienyl ruthenium(II) which is a source material gas for Ru is supplied and temperature is raised.

The mesa stripe is heated at 650° C., so that mass transport is performed while supplying bis (η5-2,4-dimethylpentadienyl ruthenium(II) into the growth reactor. As a result, InP is transported from the InP layers 52 and 56 to both side walls of photoabsorption layer 54, so that the region 64 is formed on the side walls of the photoabsorption layer.

Figure 25B:
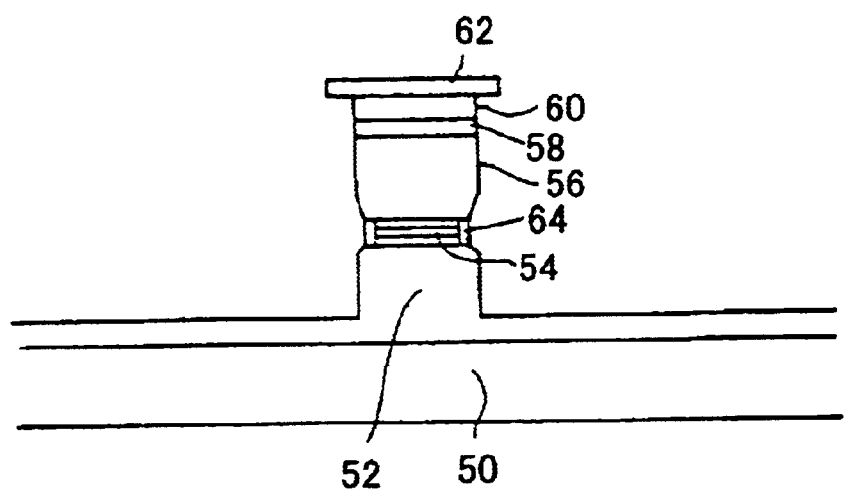

At this time, as shown in FIG. 25B, bis (θ5-2,4-dimethylpentadienyl ruthenium(II) is decomposed by heat and Ru is produced, Ru metal is incorporated into the region formed by mass transport 64, and the region becomes semi-insulating. This process shown in FIG. 25B is remarkably different from the conventional technology.

In conventional mass transport process, since Ru is not doped, impurity included in the cladding layer is doped in the region formed by mass transport. That is, according to the conventional mass transport process, since there are spaces on both sides of the photoabsorption layer, a region of the cladding layer is dissolved, and the dissolved material is moved to the spaces and recrystallized. Therefore, the impurity doped in the cladding layer is incorporated in the spaces, so that a pn junction is formed on both sides of the photoabsorption layer. In addition, since Ru is not doped in the burying layers of both sides of the photoabsorption layer by the conventional method, the incorporated impurity is not compensated for.

On the other hand, according to the present invention, since the source material gas of Ru is supplied when mass transport is performed, Ru is doped in the region formed by mass transport 64. The Ru compensates for the impurity included in the InP cladding layer so that Ru makes the region formed by mass transport 64 semi-insulating.

Figure 25C:
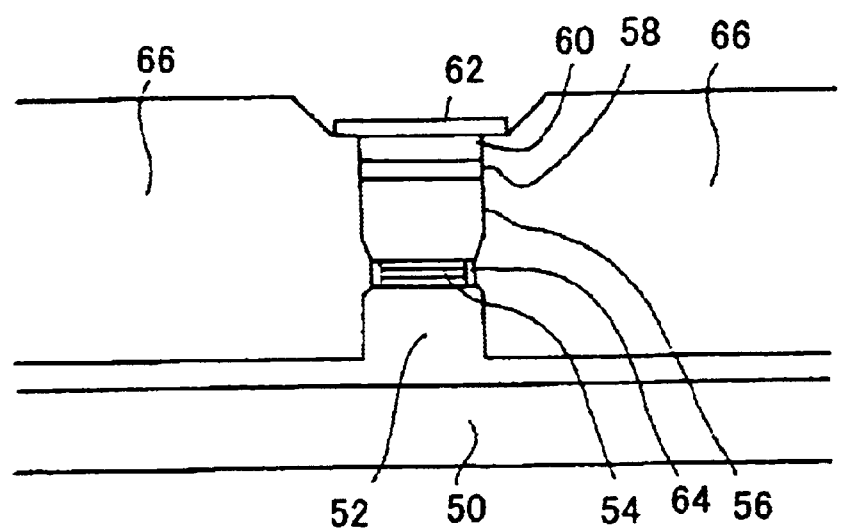

Next, as shown in FIG. 25C, the InP layer 66 is grown while doping Ru on the vertical mesa stripe substrate by using the MOVPE method.

Trimethylindium, triethylgallium, trimethylaluminum, arsine and phosphine are used for the source material, and bis(η5-2,4-dimethylpentadienyl ruthenium(II) is used for the source material for Ru.

After that, the dielectric mask 62 is removed, AuZn/Au p-stripe electrode 68 is formed by vapor deposition and lift-off process, and an AuGeNi n-electrode 70 is formed by vapor deposition.

The section structure of the thus fabricated electroabsorption modulator is as shown in FIG. 23. By observing this section by using a scanning electron microscope, it can be observed that no void was obtained between the photoabsorption layer 54 and the region formed by mass transport 64, and between the mesa stripe and the burying layer 66. This indicates that a good burying layer due to mass transport is obtained.

After cleaving this structure, the device was mounted and the characteristics were evaluated. As a result, the device indicated good performance as an electroabsorption modulator. That is, capacitance of the modulator is 0.5 pF, which is a half of 1 pF which is a conventional capacitance. That is, the electroabsorption modulator of the present invention is very applicable for high speed modulator, and, it can perform high speed modulation up to 15 GHz.

In addition, dark current is improved. That is, in reverse bias of 2V, it is below 1 nA for 90% of the chips.

According to burying by mass transport of the present invention, a burying layer without voids can be obtained more easily compared with the burying layer of the conventional epitaxial growth method, and since inter-diffusion between Ru and Zn does not occur, leakage current on the side surface of the photoabsorption layer is remarkably small.

Thus, it can be realized that the buried structure is useful for the device operated by a reverse bias such as the electroabsorption modulator. By this modulator, an extinction ratio of 15 dB at an applied voltage of 1.5V and a frequency response of 15 GHz at 3 dB bandwidth were obtained.

According to the above-mentioned embodiment, although the Ru-doped InP burying layer is used for the burying layer 66, the burying layer 66 is not limited to the Ru-doped InP burying layer. As the burying layer, a Ru-doped InGaAsP layer, a Ru-doped InAlAs layer and a Ru-doped InGaAlAs layer of which the refractive index can be changed by changing the composition for adjusting the light propagation mode can also be used, and the same effect can be obtained.

In this embodiment, although an electroabsorption modulator using InGaAlAs/InAlAs MQW as the photoabsorption layer is shown as an example, a laser diode with the MQW active layer can be also fabricated. In addition, the same effect can be obtained by substituting a bulk layer for MQW as the active layer. In addition, the same effect can be obtained by forming MQW with InGaAsP based material.

Sixth Embodiment

Next, a pn-buried structure laser diode will be described as the sixth embodiment of the present invention. The structure will be described while explaining the fabrication method.

Figure 26A:
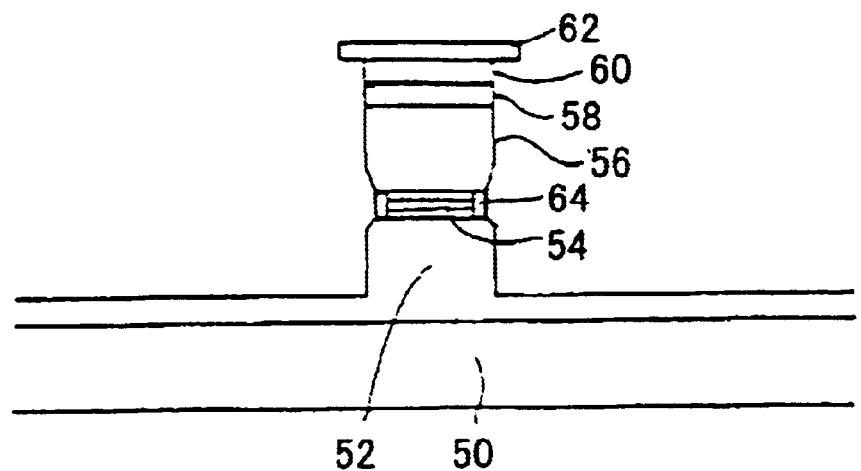
FIGS. 26A–26C are figures for explaining a fabrication method of the electroabsorption modulator of the sixth embodiment.

In the same way as the fifth embodiment, a mesa stripe structure shown in FIG. 26A is formed by processes shown in FIG. 24A–FIG. 25B.

In the process of mass transport, bis($\eta$5-2,4-dimethylpentadienyl ruthenium(II), which is the source material gas of Ru, is supplied so that Ru is doped to the burying layer formed by mass transport. As a result, the region formed by mass transport 64 becomes semi-insulating.

Figure 26B:
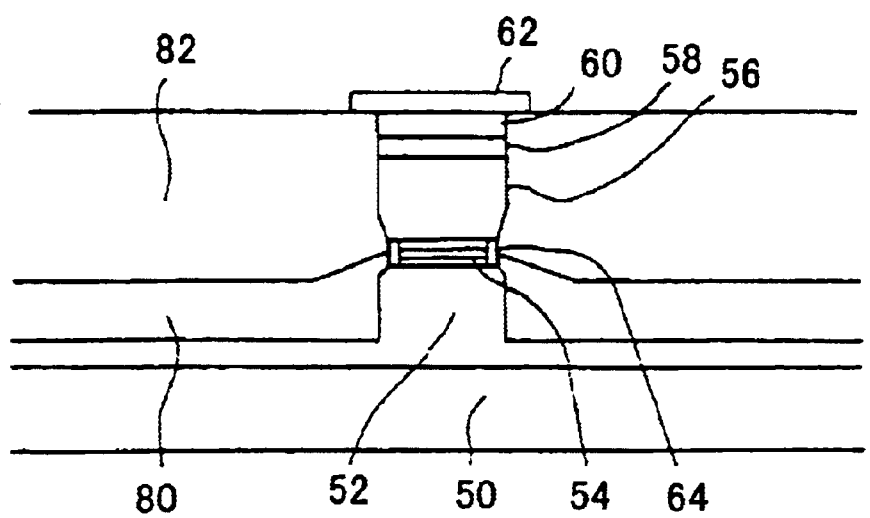
Figure 26C:
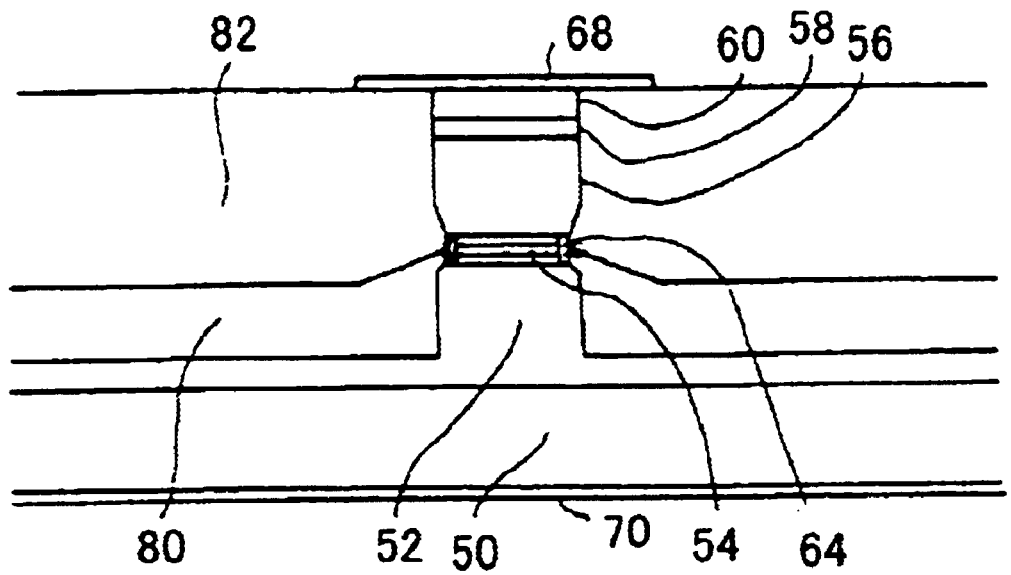

Next, without taking out the device from the growth reactor, as shown in FIG. 26B, Zn-doped p-InP burying layer 80 (0.7 $\mu$m thick) is grown, and, continuously, Si-doped n-InP burying layer 82 (1.3 $\mu$m thick) is grown at lower temperature than mass transport.

It should be noted that leakage currents do not increase even when the region formed by mass transport 64 is placed adjacent to the p-InP burying layer 80 since the region formed by mass transport 64 is semi-insulated by Ru doping.

After that, the dielectric mask is removed, and an n-electrode 70 of AuGeNi is formed on the substrate side and a p-electrode 68 of AuZn is formed on the top surface of the mess stripe. Since the buried structure of this laser suppresses the leakage currents on the side of the active layer, the emitting efficiency was improved by 5%. In this embodiment, although the n-InP substrate was taken as an example, a p type substrate can also be used by reversing the conductivity. As mentioned above, according to the present invention, laser diodes with high emitting efficiency can be fabricated at high yield.

As mentioned above, according to the present invention, increase of leakage currents and junction capacitance which are conventional problems can be suppressed by burying the active region of the semiconductor optical device with the Ru-doped semi-insulating layer. And, device structures and fabrication methods adopting this idea are realized.

In the above-mentioned embodiments, bis($\eta$5-2,4-dimethylpentadienyl ruthenium(II) was taken as an example of the source material gas for Ru. However, the source material gas for Ru is not limited to it. Source material gases for other organic metals including Ru can be used.

As described specifically, according to the present invention, the Ru-doped semiconductor layer becomes semi-insulating, and inter-diffusion between Ru and the p type impurity does not occur, so that a stable semi-insulating layer can be realized and a current blocking layer of high quality can be realized. Therefore, a remarkable effect can be obtained in that high performance modulators and light-emitting devices that decrease the pn junction area, decrease leakage currents on the side walls of the active regions, and that indicate high frequency response can be realized.

In addition, by supplying the metalorganic gas including Ru in the growth reactor when performing mass transport, Ru can be easily doped in the region formed by mass transport. Thus, in the pn buried structure of the present invention, leakage current paths can be prevented. And, in the semi-insulating buried structure, inter-diffusion can be prevented, so that a remarkable effect can be obtained in that a method for fabricating the high performance semiconductor optical device with low leakage current and low junction capacitance with high yields can be realized.

As mentioned above, according to the present invention, the Ru-doped layer is provided in the both sides of the stacked body processed like the mesa stripe, and another layer with a different composition or with a different dopant is provided in the other region. By decreasing the ratio of growth process of the Ru-doped layer to the total burying layer growth process, defects due to difficulty of growth can be prevented so that fabrication yields can be improved. In addition, diffusion of Zn can be prevented and the occurrence of defect in the fabrication process can be prevented.

In addition, by supplying the metalorganic gas including Ru in the growth reactor when performing mass transport, semiconductor optical devices with a stable semi-insulating layer in which inter-diffusion between Ru and the p type impurity is prevented can be realized by using mass transport.

The present invention is not limited to the specifically disclosed embodiments, and variations and modifications may be made without departing from the scope of the invention.

What is claimed is:

1. A semiconductor optical device, comprising:
   a semiconductor substrate;
   a stacked body formed at least by a cladding layer having a first conductivity, an active region formed by an active layer or a photoabsorption layer and a cladding layer having a second conductivity, said stacked body being provided on said semiconductor substrate and formed like a mesa stripe;
   wherein both sides of said stacked body are buried by a burying layer formed at least by a semi-insulating semiconductor crystal;
   said burying layer includes a first layer that is placed adjacent to both sides of said stacked body and a second layer that is placed adjacent to said first layer;
   said first layer includes Ru as a dopant;
   composition of said second layer is different from composition of said first layer, or, a dopant of said second layer is different from a dopant of said first layer.

2. The semiconductor optical device as claimed in claim 1, wherein said composition of said first layer is Ru-doped InGaAlAs or Ru-doped InAlAs.

3. The semiconductor optical device as claimed in claim 2, wherein said composition of said second layer is Ru-doped InP.

4. The semiconductor optical device as claimed in claim 2, wherein said composition of said second layer is Fe-doped InP.

5. The semiconductor optical device as claimed in claim 1, wherein said composition of said first layer is Ru-doped InP.

6. The semiconductor optical device as claimed in claim 5, wherein said composition of said second layer is Fe-doped InP.

* * * * *